(12) United States Patent
Yu et al.

(10) Patent No.: US 9,720,616 B2
(45) Date of Patent: Aug. 1, 2017

(54) DATA-RETENTION CONTROLLER/DRIVER FOR STAND-ALONE OR HOSTED CARD READER, SOLID-STATE-DRIVE (SSD), OR SUPER-ENHANCED-ENDURANCE SSD (SEED)

(71) Applicant: Super Talent Technology Corp., San Jose, CA (US)

(72) Inventors: Frank Yu, Palo Alto, CA (US); Abraham C. Ma, Fremont, CA (US); Shimon Chen, Los Gatos, CA (US)

(73) Assignee: Super Talent Technology, Corp., San Jose, CA (US)

( * ) Notice: Subject to any disclaimer, the term of this patent is extended or adjusted under 35 U.S.C. 154(b) by 3 days.

(21) Appl. No.: 14/935,996

(22) Filed: Nov. 9, 2015

(65) Prior Publication Data

US 2016/0070474 A1    Mar. 10, 2016

Related U.S. Application Data

(60) Continuation-in-part of application No. 12/475,457, filed on May 29, 2009, now Pat. No. 8,266,367, and
(Continued)

(51) Int. Cl.
  *G06F 12/00*    (2006.01)
  *G06F 13/00*    (2006.01)
  (Continued)

(52) U.S. Cl.
  CPC ............ *G06F 3/064* (2013.01); *G06F 3/0604* (2013.01); *G06F 3/0608* (2013.01);
  (Continued)

(58) Field of Classification Search
  CPC ............ G06F 12/0246; G06F 13/4282; G06F 2212/7203; G06F 2212/7208;
  (Continued)

(56) References Cited

U.S. PATENT DOCUMENTS 7,710,777 B1 * 5/2010 Montierth ............... G11C 16/10
                                                     365/185.09
8,112,574 B2 * 2/2012 Lee ..................... G06F 12/0246
                                                     202/206
(Continued)

*Primary Examiner* — Sheng-Jen Tsai
(74) *Attorney, Agent, or Firm* — Stuart T. Auvinen; gPatent LLC

(57) ABSTRACT

A Green NAND SSD Driver (GNSD) driver executes on a host to increase data-retention of flash memory attached to a Super Enhanced Endurance Device (SEED) or Solid-State Drive (SSD). Host accesses to flash are intercepted by the GNSD driver using upper and lower-level filter drivers. A retention-check timer causes a retention routine to be periodically executed. The routine sends high-level commands to the SEED that causes the SEED to refresh either all data or just data blocks with older write dates. Data is refreshed by moving to a new physical block. The retention routine can track write dates of logical blocks and command a SSD to move logical blocks with older write dates. A retention card has a controller that performs the retention routine when not connected to a host, while a SEED power card allows the SEED to refresh data when no host is attached to the SEED.

12 Claims, 37 Drawing Sheets

Related U.S. Application Data a continuation-in-part of application No. 12/347,306, filed on Dec. 31, 2008, now Pat. No. 8,112,574, and a continuation-in-part of application No. 12/141,879, filed on Jun. 18, 2008, now abandoned, and a continuation-in-part of application No. 13/540,569, filed on Jul. 2, 2012, now Pat. No. 8,959,280, and a division of application No. 13/730,797, filed on Dec. 28, 2012, now Pat. No. 8,954,654, and a continuation-in-part of application No. 14/575,943, filed on Dec. 18, 2014.

(51) Int. Cl.

| | | |
|---|---|---|
| *G06F 13/28* | (2006.01) | |
| *G06F 3/06* | (2006.01) | |
| *G06F 13/42* | (2006.01) | |
| *G06F 12/02* | (2006.01) | |
| *G11C 11/56* | (2006.01) | |
| *G11C 13/00* | (2006.01) | |
| *G11C 29/00* | (2006.01) | |
| *G11C 16/34* | (2006.01) | |
| *G06F 12/14* | (2006.01) | |

(52) U.S. Cl.
CPC .......... *G06F 3/0631* (2013.01); *G06F 3/0643* (2013.01); *G06F 3/0647* (2013.01); *G06F 3/0685* (2013.01); *G06F 3/0688* (2013.01); *G06F 12/0246* (2013.01); *G06F 13/4282* (2013.01); *G06F 12/1408* (2013.01); *G06F 2212/401* (2013.01); *G06F 2212/7203* (2013.01); *G06F 2212/7208* (2013.01); *G06F 2212/7211* (2013.01); *G11C 11/5678* (2013.01); *G11C 13/0004* (2013.01); *G11C 16/349* (2013.01); *G11C 29/765* (2013.01)

(58) Field of Classification Search
CPC .... G06F 3/0604; G06F 3/0608; G06F 3/0631; G06F 3/064; G06F 3/0643; G06F 3/0647; G06F 3/0685; G06F 3/0688
USPC ........................................................ 711/103
See application file for complete search history.

(56) References Cited

U.S. PATENT DOCUMENTS

| | | | | |
|---|---|---|---|---|
| 8,266,367 | B2* | 9/2012 | Yu .......................... | G06F 3/0608 711/103 |
| 8,959,280 | B2* | 2/2015 | Yu .......................... | G06F 3/0608 711/103 |
| 9,223,642 | B2* | 12/2015 | Yu .............................. | G06F 1/30 |
| 2005/0177780 | A1* | 8/2005 | Chang ..................... | H02J 9/061 714/47.1 |
| 2006/0087885 | A1* | 4/2006 | Murakami ......... | G11C 16/0483 365/185.17 |
| 2008/0082741 | A1* | 4/2008 | Biessener ............. | G06F 3/0607 711/112 |
| 2008/0320209 | A1* | 12/2008 | Lee ....................... | G06F 12/0246 711/103 |
| 2009/0172267 | A1* | 7/2009 | Oribe ................. | G11C 16/3418 711/103 |
| 2009/0198874 | A1* | 8/2009 | Tzeng ................. | G06F 12/0246 711/103 |
| 2009/0240869 | A1* | 9/2009 | O'Krafka ............ | G06F 12/0284 711/103 |
| 2009/0310408 | A1* | 12/2009 | Lee ..................... | G11C 11/5628 365/185.03 |
| 2010/0293420 | A1* | 11/2010 | Kapil ..................... | G06F 12/08 714/710 |
| 2012/0017037 | A1* | 1/2012 | Riddle .............. | G06F 17/30519 711/103 |
| 2012/0084490 | A1* | 4/2012 | Choi ....................... | G11C 16/02 711/103 |
| 2013/0007344 | A1* | 1/2013 | Belgal ................ | G06F 12/0246 711/103 |
| 2013/0086309 | A1* | 4/2013 | Lee ..................... | G06F 12/0246 711/103 |
| 2013/0145085 | A1* | 6/2013 | Yu ....................... | G06F 12/0246 711/103 |
| 2014/0006688 | A1* | 1/2014 | Yu .......................... | G11C 16/10 711/103 |
| 2014/0281151 | A1* | 9/2014 | Yu ............................. | G06F 1/30 711/103 |
| 2014/0310574 | A1* | 10/2014 | Yu ....................... | G06F 11/1072 714/773 |
| 2015/0106557 | A1* | 4/2015 | Yu ....................... | G06F 12/0246 711/103 |
| 2016/0139982 | A1* | 5/2016 | Yu ...................... | G11C 14/0018 714/768 |

* cited by examiner

FIG. 9A

BLK WRITE DATE STORED

BLOCK STATUS

000 EMPTY BLK
001 USED BLK
010 BLK WITH GARBAGE
011 WHOLE BLK BAD
100 EMPTY BLK, BAD PAGES
101 USED BLK, BAD PAGES
110 BLK WITH GARBAGE, BAD PAGES
111 FACTORY BAD BLK

PAGE STATUS

000 EMPTY PAGE
001 EMPTY PAGE +PROTECT
010 USED PAGE
011 USED PAGE +PROTECT
100 GARBAGE PAGE
101 GARBAGE PAGE +PROTECT
11X BAD PAGE

| $3^b$ | $13^b$ | $16^b$ |
|---|---|---|
| BLK STATUS | ERASE CNT | WR DATE |

471

BAD BLK/ERASE CNT TABLE

| $3^b$ |
|---|
| PG STATUS |

473

PAGE STATUS TABLE

FIG. 9B

PAGE WRITE DATE STORED

BLOCK STATUS

000 EMPTY BLK
001 USED BLK
010 BLK WITH GARBAGE
011 WHOLE BLK BAD
100 EMPTY BLK, BAD PAGES
101 USED BLK, BAD PAGES
110 BLK WITH GARBAGE, BAD PAGES
111 FACTORY BAD BLK

PAGE STATUS

000 EMPTY PAGE
001 EMPTY PAGE +PROTECT
010 USED PAGE
011 USED PAGE +PROTECT
100 GARBAGE PAGE
101 GARBAGE PAGE +PROTECT
11X BAD PAGE

| $3^b$ | $13^b$ |
|---|---|
| BLK STATUS | ERASE CNT |

471'

BAD BLK/ERASE CNT TABLE

| $3^b$ | $16^b$ |
|---|---|
| PG STATUS | WR DATE |

473'

PAGE STATUS TABLE

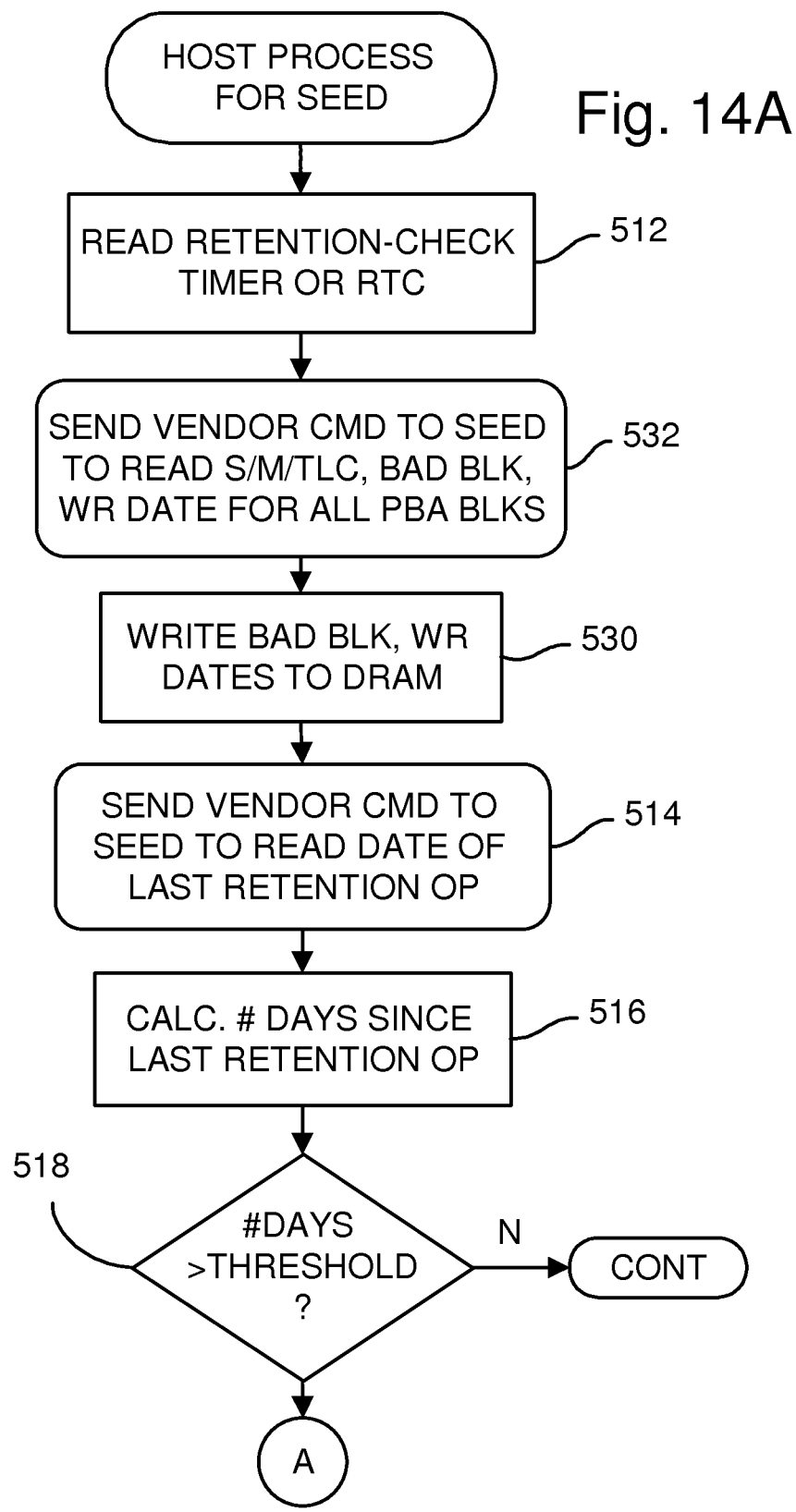

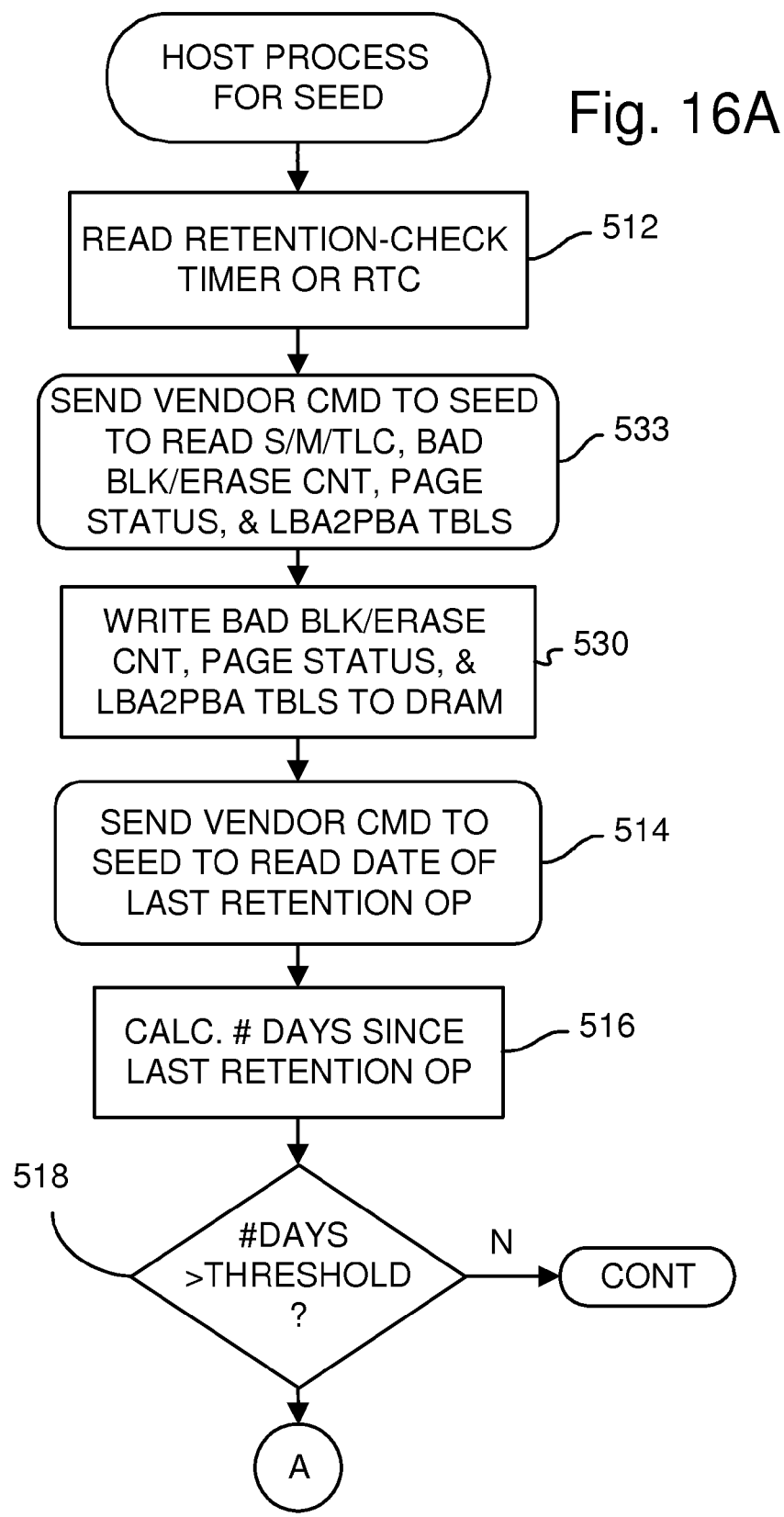

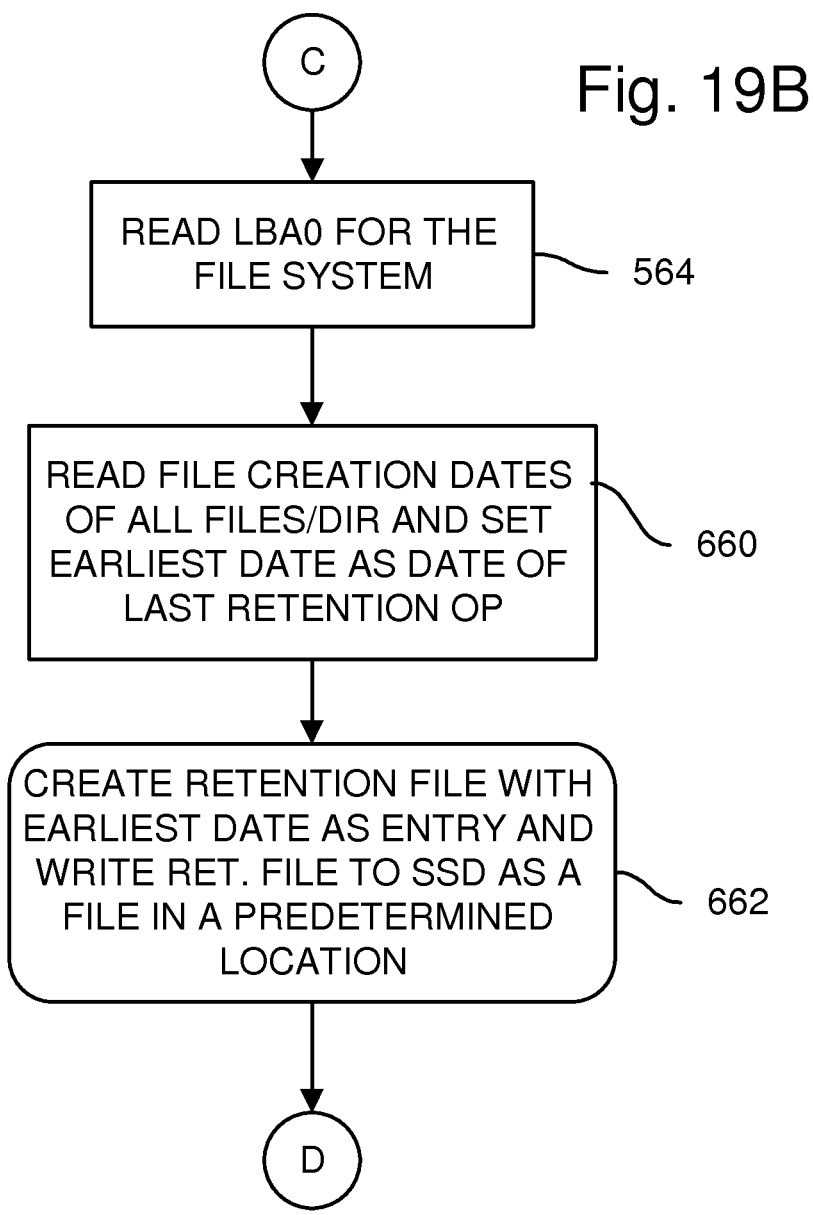

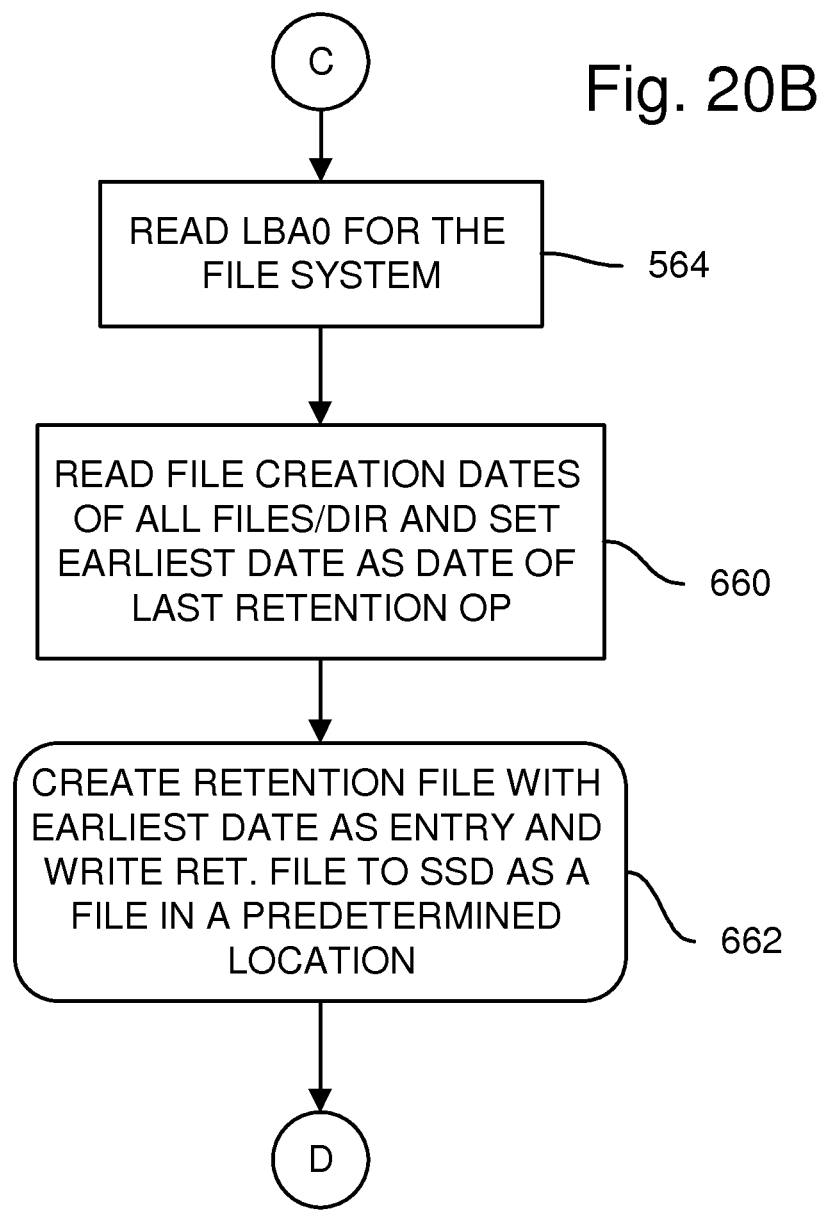

US 9,720,616 B2

DATA-RETENTION CONTROLLER/DRIVER FOR STAND-ALONE OR HOSTED CARD READER, SOLID-STATE-DRIVE (SSD), OR SUPER-ENHANCED-ENDURANCE SSD (SEED)

RELATED APPLICATION

This application is a continuation-in-part (CIP) of "Virtual Memory Device (VMD) Application/Driver for Enhanced Flash Endurance", U.S. Ser. No. 14/575,943, filed on Dec. 18, 2014, which is a divisional of "Virtual Memory Device (VMD) Application/Driver with Dual-Level Interception for Data-Type Splitting, Meta-Page Grouping, and Diversion of Temp Files to Ramdisks for Enhanced Flash Endurance", U.S. Ser. No. 13/730,797, filed on Dec. 28, 2012.

This application is a continuation-in-part (CIP) of "Super-Endurance Solid-State Drive with Endurance Translation Layer (ETL) and Diversion of Temp Files for Reduced Flash Wear", U.S. Ser. No. 13/540,569, filed on Jul. 2, 2012.

This application is a continuation-in-part (CIP) of "Multi-Level Striping and Truncation Channel-Equalization for Flash-Memory System", U.S. Ser. No. 12/475,457, filed on May 29, 2009.

This application is a continuation-in-part of "Swappable Sets of Partial-Mapping Tables in a Flash-Memory System With A Command Queue for Combining Flash Writes", Ser. No. 12/347,306, filed on Dec. 31, 2008, now U.S. Pat. No. 8,112,574.

This application is a continuation-in-part of "High Performance and Endurance Non-volatile Memory Based Storage Systems", U.S. Ser. No. 12/141,879, filed Jun. 18, 2008.

This application is related to "High Endurance Non-volatile Memory Devices", U.S. Pat. No. 7,953,931, Filed on Feb. 21, 2008.

This application is related to "Cell-Downgrading and Reference-Voltage Adjustment for a Multi-Bit-Cell Flash Memory", U.S. Pat. No. 7,333,364, Filed on Apr. 19, 2007.

FIELD OF THE INVENTION

This invention relates to flash-memory systems, and more particularly to increased data-retention of flash memory drives.

BACKGROUND OF THE INVENTION

Flash memory is widely used for peripheral storage in computer systems, and for primary storage in portable devices. NAND flash memory, invented by Dr. Fujio Masuoka of Toshiba in 1987, uses electrically-erasable programmable read-only memory (EEPROM) cells that store charge on a floating gate. Cells are typically programmed by an avalanche current, and then erased using quantum-mechanical tunneling through a thin oxide. Unfortunately, electrons may escape from the floating gate. Such leakage may cause data stored as charge on the floating gate of a flash-memory cell to be lost over time. Higher-density flash memory cells using newer technologies may exhibit a data-retention problem.

As the density and size of flash memory has increased, the cell size has been shrunk. The thickness of oxides including the tunneling oxide has also been reduced. The thinner oxides are more susceptible to leakage. This leakage may be slight and occur over long periods of time. For example, data may not be lost for weeks or years. If the flash cell is over-written before the retention period ends, the data is not lost. However, unlike DRAMs, merely reading a flash cell does not restore the cell charge. A flash write is necessary to refresh or restore the charge in a flash cell.

The retention time for flash cells has been decreasing as densities increase and oxide layer thicknesses decrease. If current trends continue, future flash memories may lose data in less than a week. Such a low retention could severely limit the applications that flash memory could be used for, and have severe impacts for Solid-State-Disk (SSD) applications.

One method to increase the density of flash memory is to store more than one bit per memory cell. Different voltage levels of the cell are assigned to different multi-bit values, such as four voltage ranges for a two-bit cell. However, the noise margins are reduced for the multi-level-cell (MLC) and TLC flash technologies and retention problems are exacerbated.

It is likely that the underlying flash technology will have lower retention in the future. Flash drives may compensate for the lower retention tolerance of the underlying flash memories by a variety of techniques. For example, a flash memory system may perform background operations to periodically move blocks of flash data to ensure that retention times are not violated. The flash memory may have a longer retention time when it is new (erase/write count is low). The retention time deteriorates as the erase/write count increased.

What is desired is a host software drivers and controllers for a flash drive that compensate for lower retention tolerances of the underlying flash memory devices. A Green NAND SSD Driver (GNSD) application and driver for a host connected to a standard Solid-State Drive (SSD) or a Super Enhanced Endurance Device (SEED) drive is desired that ensures data retention of the underlying flash memory. A GNSD driver that can ensure data retention on both standard SSD and SEED drives is desired.

BRIEF DESCRIPTION OF THE DRAWINGS

FIGS. 9A-B show bad block/erase count tables and page status tables.

FIG. 14A-C is a flowchart of a host block-tracking retention process when a SEED is attached.

FIGS. 16A-D is a flowchart of an alternative host block-tracking retention process when a SEED is attached.

FIGS. 19A-C is a whole-device host process for refreshing non-SEED SSD's based on written files.

FIGS. 20A-C is a LBA-based host process for refreshing non-SEED SSD's.

DETAILED DESCRIPTION

Figure 1:
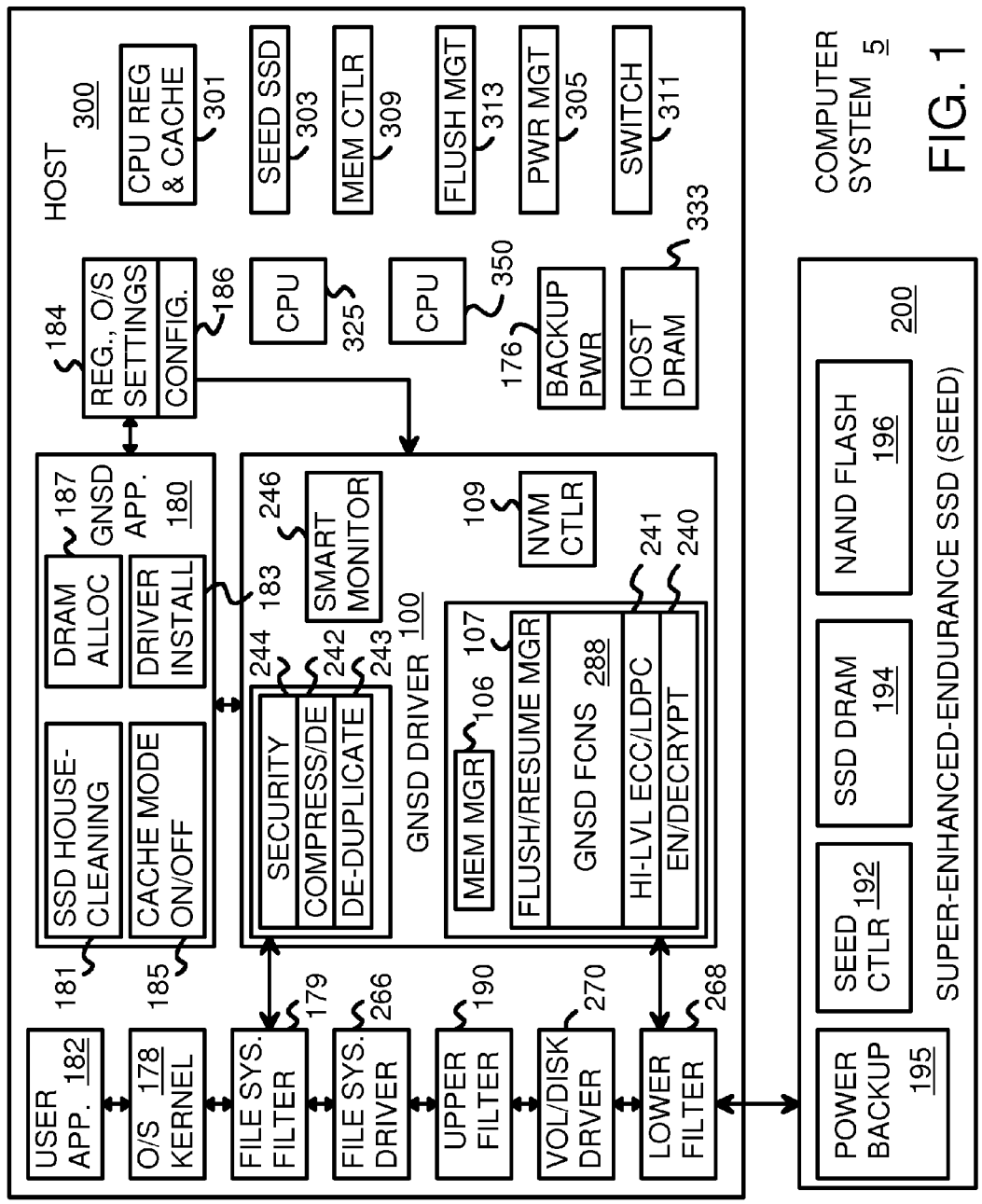
FIG. 1 is a block diagram of a Green NAND SSD Driver (GNSD) application and driver on the host.

The present invention relates to an improvement in high-retention flash-memory drivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The wear on underlying flash devices may be reduced by blocking unnecessary writes to the flash memory. Increased wear may reduce retention times, so reducing wear may benefit retention as well. A Green NAND SSD Driver (GNSD) application and driver executing on a host may block or combine writes before they reach the flash memory, thus reducing the write frequency to the flash memory. The GNSD diver intercepts host writes to caches and ramdisks in the host's DRAM and/or in the SSD DRAM. The GNDS driver also has a retention-check timer. When the retention-check timer reaches its trigger value, the GNSD driver executes a retention routine.

The retention routine can operate with both intelligent SEED SSD's, and legacy SSD's. When an intelligent SEED SSD is present, the GNSD routine sends high-level vendor commands to the SEED SSD to have the SEED perform retention operations that look for blocks of data that were written a long time ago. These blocks are moved to refresh the data. For legacy SSD's that do not support high-level refresh commands, the GNSD can track logical block addresses and move logic blocks that have been written for more than the specified data-retention time.

DRAM buffers in the host or on the flash drive SSD device can store data that does not need to be stored permanently and thus does not need to be written to flash. The DRAM is not only faster, but also has a much higher endurance since it can be over-written more than one million times. DRAM is a reliable technology, being invented in 1966 by Dr. Robert Dennard at IBM.

A typical host creates many temporary files, such as during Internet browsing, or when running certain bloated application programs, that are not critical. The inventors realize that these files do not need to be written to flash memory, reducing flash wear.

A typical system also frequently over-writes certain kinds of data. Such frequently-over-written data is best stored in a DRAM buffer, either on the host or in the flash drive and copied to the flash memory according to a policy (such as based on time elapsed, capacity allocated, etc.) or upon power down or power failure. Storing such frequently-over-written data to flash only on power down can also significantly reduce the wear of the flash devices. Most of the meta data are small in size and grouped together such as in FAT tables. Every update involves a write to only very small portion of the flash page. Storing the meta-data in the DRAM can over time reduce unnecessary writes to flash.

Such frequently-over-written data may include log files that are frequently updated with new events. The latest copy is examined, usually after a system crash. The File Allocation Table (FAT) is another frequently-over-written location, since it is updated when files are created or expanded. The FAT table is a relatively small portion of memory, but its frequent access can significantly increase wear if every update of the FAT is copied to flash. The File Descriptor Block (FDB) is a similar structure that is frequently over-written, such as over-writing the "Date Accessed" when simply accessing and displaying a file list in windows explorer. FDB/FAT holds the meta data for the file system from the host. The various tables used together with the DRAM buffer have meta data created to store the file system to the DRAM and Flash.

Bad-block tables, erase counters, garbage collection, spare and swap blocks, mapping tables, and other files created by the flash drive need to be stored to flash according to a policy or on power down/failure. The flash system meta files may also be stored in the DRAM buffer and copied to flash according to a policy or on power down/failure to reduce flash wear. The above-mentioned tables and meta files are stored in flash memory at power up. They are loaded into a DRAM buffer at device initialization. Subsequent host data read/writes change the data contents. When power down/failure occurs, dirty tables and meta files need to be written or backed up to flash. Host data in the write cache, FIFO buffers, data-in buffer, endurance spare and swap blocks, and other buffers in the flash drive may also be copied to flash on a power failure to allow for system recovery if an exact recovery point is needed for a particular application.

Paging files that the system uses for memory management, when images of the host's main DRAM memory are traditionally moved to a hard disk, or to a flash drive. Page swapping files are not critical if lost on a power failure, since the system would need to be rebooted anyway, and the memory management and paging systems would be re-initialized, wiping out any stored paging files. These paging files may also be stored in the DRAM buffer, and do not have to be copied to flash on a power down/failure, thus reducing flash wear.

Further reductions in flash wear can be achieved by packing data. For example, data that is less than a whole page in flash (partial-page data) may be stored with other partial-page data in a single page in flash, rather than in many separate pages. A multi-channel system may have larger units such as meta-pages that have one page per channel, or the number of channels times the page size. Flash wear may be further reduced by packing into meta-pages rather than the smaller pages.

While the flash-wear savings from each technique may provide various improvements, these techniques when used together may significantly increase flash endurance and data retention. A GNSD application and driver may provide higher retention for the flash drive using these techniques. The retention manager is used to refresh the data which sits in the flash devices and has surpassed the flash guaranteed retention time. The retention manager manages a time stamp to the data file or data block when it is written. Periodically such as a week, check the time stamp date against the current time to decide that data need be refreshed or not.

FIG. 1 is a block diagram of a Green NAND SSD Driver (GNSD) application and driver on the host that creates and manages multiple caches and buffers on both the host and on a super-endurance flash drive that has low-retention flash memory. Host 300 has one or more processors 325, 350 that executes instructions for programs such as user apps 182 and for an operating system (OS) kernel 178 such as Windows, Linux, Apple OS, or Android, etc. File system filter driver 179 works in conjunction with one or more file systems to manage file I/O operations.

Backup power 176 provides power to host 300 when the main power source fails, enabling host 300 to send critical data to Super Enhanced Endurance Device (SEED) 200 for storage in NAND flash memory 196 when power fails. Backup power 176 can use a battery, or an uninterruptible Power Supply (UPS), etc. This gives the host processor time to turn off applications and to properly shut down the attached devices. SEED 200 has its own power backup 195, allowing SEED 200 to write critical data to NAND flash memory 196 when the main power fails. Power backup 195 can utilize capacitors, super-capacitors, or a battery. Alternatively, if backup power 176 has enough power to gracefully turn off the system, power backup 195 in SEED 200 is not needed, such as when host 300 is notebook or Smart Phone.

GNSD application 180 is an application executing on host 300. GNSD application 180 and GNSD driver 100 can be used to ease the loads of SEED 200. GNSD application 180 and GNSD driver 100 can separate and/or store data such as temporary files, paging files etc., that are not meant to be permanently stored to flash. GNSD driver 100 can manage memory to store such temporary data.

GNSD driver 100 may use the host CPU to perform tasks such as compression/decompression engine 242, and encryption/decryption engine 240. Data from user apps 182 that is written by OS kernel 178 is intercepted by upper-level file filter driver 190 and passed to GNSD driver 100 for compression and/or encryption before being sent to file system driver 266. Then low-level file filter driver 268 again intercepts the data for more processing by GNSD driver 100.

Data that is finally ready to be written to SEED 200 is sent from GNSD driver 100 to volume manager 270, which manages storage volumes such as SEED 200. SEED controller 192 in SEED 200 may store the data in SSD DRAM buffer 194 and then to NAND flash memory 196 on power down or when SSD DRAM buffer 194 is full.

SSD housecleaning 181 in GNSD application 180 performs various high-level functions such as garbage collection, removing old unused files. SSD housecleaning 181 may be performed periodically, such as daily, weekly, or when GNSD driver 100 manages DRAM. Driver Installation 187 in GNSD application 180 installs the user selected SSD driver when GNSD driver started. DRAM Allocation 183 in GNSD application 180 allocates and initializes DRAM capacity from the OS for using with GNSD Driver 100 and returning DRAM to OS when GNSD Driver exist or when cache mode is shut down. Cache Mode ON/OFF 185 controls cache mode. With Cache Mode OFF in GNSD application 180, GNSD driver 100 can flush all DRAM cache data to SEED 200 and remain in active. With Cache Mode ON, GNSD driver 100 can set up the DRAM cache environment. Note that, when a "Flush All" command is received, GNSD driver can turn Cache Mode to OFF first, after the flush finished, it can turn the Cache Mode to ON. With Cache Mode OFF, "Consequence Host access (read/write) to Device", the IRP access will be bypassing the GNSD driver and passed down to the next driver directly. With Cache Mode ON, "Consequence Host access (read/write) to Device" will be diverted to GNSD driver and DRAM cache.

Configuration settings 186 and registry and OS settings 184 may be set by OS kernel 178 or by other programs to define the size of DRAM buffers or other system variables, and to manage preferred functions of GNSD application 180 and GNSD driver 100.

Configuration settings 186 and registry and OS settings 184 may have various settings that may improve flash endurance and performance. For example, settings may enable or disable write caching, drive indexing, search indexing, defragmentation, host hibernation, prefetching, superfetching, and windows write cache buffer flushing. Prefetching, indexing, hibernation, and defragmentation may cause additional writes to flash and thus reduce endurance. Write caching and write cache buffer flushing is disabled since the GNSD driver has its own write caching and flushing functions. Thus flash endurance may be improved by disabling these features.

Some optional components shown in FIG. 1 are useful for abnormal power down situations of computer system 5. Power management 305 manages stored energy when power is on and provide power to host 300 when power fails. CPU registers and cache controller 301 writes the CPU registers and caches to host DRAM and then to SEED 200 when power fails. In another embodiment SEED SSD 303 is another SSD that connects to host 300, such as through a PCIe port, USB port, NVMe port, etc. In yet another embodiment SEED SSD 303 can be located in a DRAM module and controlled by memory controller 309. CPU registers and cache controller 301 writes the CPU registers and caches to host DRAM and then to SEED 200 or SEED 303 when power fails in this alternative. Switch 311, when preset, isolates unnecessary components on host 300 so that they do not receive backup power, thus extending the period of backup power for critical components. Memory controller 309 may be present to transfer data between the host DRAM and SEED SSD 303 during abnormal power off and power restore. Smart data monitor 246 sends S.M.A.R.T. monitoring information from SEED 200 to GNSD application 180. Security 244 may perform a password verification process before allowing access to SEED 200 or data cached by GNSD driver 100. De-duplication engine 243 finds and deletes duplicate copies of data files to reduce the write load. High-level ECC/LDPC engine 241 provides error code processing.

GNSD driver 100 functions 288 are provided for improved endurance and performance of the SEED SSD in conjunction with configuration and OS settings. Below are details of GNSD driver 100 functions 288 for improved endurance and performance with configuration and OS settings:

Disabling Drive Indexing: SSD 200 seek function is fast, about 0.1 ms, and indexing may not be needed.

Disabling Drive Search Indexing: Disabling Search Indexing can help increase both the performance and longevity of the SSD. Disabling this option prevents Windows® OS from trying to keep track of every file for search purposes. A drawback could be that SSD searches may be slower.

Reducing page file size, Disabling System Restore, Hibernate, write caching, prefetch, etc. are other possible GNSD functions 288.

Memory manager 106 in GNSD driver 100 can provide various functions such as DRAM clear to reset the cache area, Trim command to remove data from flash memory, and flush settings. Flush/resume manager 107 can quickly flush DRAM data when power fails. NVM controller 109 and flush manager 313 provide flash operational assistance.

Figure 2:
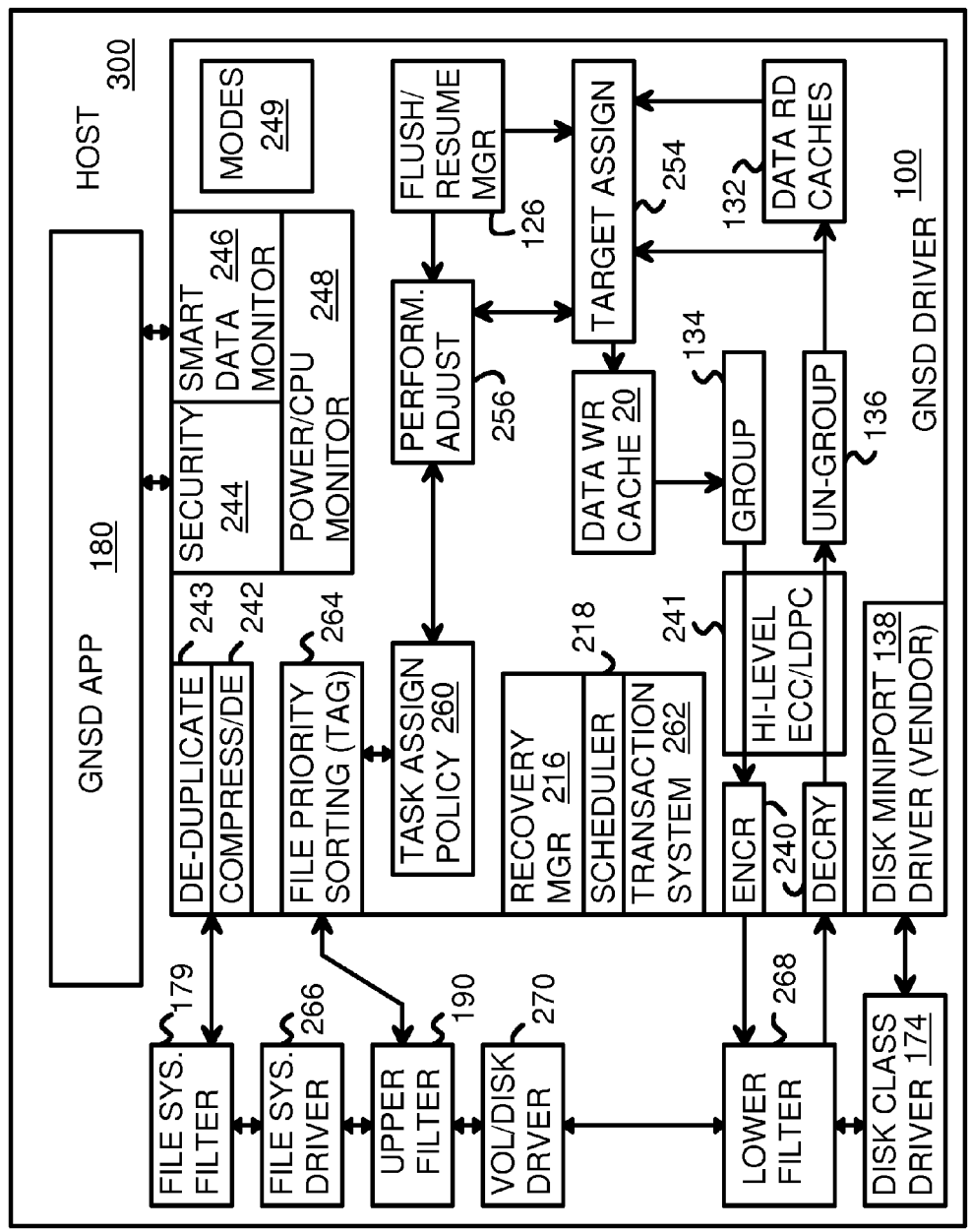
FIG. 2 is a more detailed diagram highlighting the GNSD driver on the host.

FIG. 2 is a more detailed diagram highlighting the GNSD driver on the host. Host data written by the OS kernel and intercepted by upper-level file filter driver 190 is passed to GNSD driver 100 for compression by compression engine 242 and/or encryption by encryption engine 240 before being sent to file system driver 266. High-level ECC/LDPC engine 241 provides error code processing. De-duplication engine 243 finds and deletes duplicate copies of data files to reduce the write load. Then low-level file filter driver 268 again intercepts the data for more processing by GNSD driver 100.

File priority sorting 264 sorts the data based on the data type assigned by low-level file filter driver 268, or indicated by the LBA, such as for meta-data (FAT, FDB), temp files, paging files, or user data. Temp files include windows temporary files, internet browser temporary files, etc. Alternately, this function can be optionally disabled for certain uses such as a server. Operations are given a priority by task priority assignor 260 so that higher priority tasks may be performed ahead of lower-priority tasks. Performance adjustor 256 may periodically adjust these priorities to improve performance. Target assignor 254 then sends the data to data write cache 20.

Data that is written to SSD may be grouped by grouper 134 before being sent to volume manager 270 and on to SEED 200. Disk class driver 174 may route the data to a selected partition or disk. Disk miniport driver 138 manages vendor-specific functions of the attached SSD's. Ungrouper 136 ungroups data that was retrieved from SEED 200 before being transferred to data read caches 132.

Transaction system 262 ensures that data is written completely to SEED 200. Recovery manager 216 determines which write transactions were not completed due to abnormal power off, and helps applications to do the necessary redo or undo to make the data persistent. Scheduler 218 manages transaction system 262 to manage and record write to SSD transactions such as start, abort, and commit.

When power monitor 248 detects a power down or failure, it activates flush/resume manager 126 to transfer data from data write cache 20 to SEED 200 for storage in flash memory. When the flush is done, flush/resume manager 126 will issue a vendor command to SEED 200 and backup power 176 or power management 305 (FIG. 1). The backup power supply if present, will turn off power to the system and only provide power to SEED 200. In case power management 305 is used, it may continue to provide power to the DRAM, SEED SSD 303, switch 311, and memory controller 309. Flush/resume manager 126 may periodically flush the contents of data write cache 20 to SEED 200 before power is lost. Security 244 may perform a password verification process before allowing access to SEED 200 or data cached by GNSD driver 100.

Various operating modes may be managed by mode controller 249. Examples of modes in computer system 5 (FIG. 1) include, without limitation, power down mode, power-saving mode, and persistent mode. In power down mode, computer system 5 goes through an orderly process of shut-down, flushing caches to SEED 200. In a power-saving mode, sometimes referred to as "Sleep Mode," selected elements of computer system 5 are powered down, but others are left running, perhaps at reduced power. Selected caches may be written to SEED 200 to preserve selected data. In persistent mode, data is preserved just as if computer system 5 is in the power-saving mode, but the computer system 5 is powered down. Hibernation mode typically is not used or is disabled, because all of the DRAM cache needs to be stored into SEED 200, potentially causing unnecessary writes.

File system filter driver 179 (FIGS. 1,2) also may work in conjunction with one or more file systems to manage file I/O operations. These operations include creating, opening, closing, and enumerating files and directories; getting and setting file, directory, and volume information; and reading and writing file data. In addition, file system filter drivers 266, 190, 268 can support file system-specific features such as caching, locking, sparse files, disk quotas, compression, security, recoverability, reparse points, and volume mount points. Configuration settings 186, and registry and OS settings 184, may be set by OS kernel 178 or by GSND application 180 to define the size of caches or other system variables, and to manage preferred functions of GNSD application 180 and GNSD driver 100.

Security engine 244 may perform a password verification process before allowing access to SEED 200 or data to be cached by GNSD driver 100. GNSD driver 100 may use the host CPU 325 to perform functions such as compression/decompression, de-duplication, and encryption/decryption. Smart data monitor 246 can send S.M.A.R.T. monitoring information from SEED 200 to GNSD application 180. S.M.A.R.T. stands for Self-Monitoring, Analysis and Reporting Technology.

An endurance flash file system has an upper-level file filter driver that executes on a host and intercepts high-level host writes to a flash drive. An encryption/decryption engine receives high-level host writes intercepted by the upper-level file filter driver and generates encrypted data and decrypts encrypted data. A compression/decompression engine also receives high-level host writes from the upper-level file filter driver and generates compressed data and decompresses compressed data. The compressed data and encrypted data are sent to a File System Driver (FSD) executing on the host.

A lower-level file filter driver also executes on the host and intercepts lower-level file system host writes to a flash drive system. A data write cache stores host write data while a data read cache stores data for reading by the host. A grouping engine groups data stored in the data write cache into meta-pages. An un-grouping engine un-groups data in stored in meta-pages into ungrouped data for storage in the data read cache. Meta-pages are sent from the grouping engine to a volume manager for transfer to a flash memory. Also, meta-pages stored in the flash memory are received by the un-grouping engine.

A file priority tag sorter generates a data type for host writes received. A task policy assignor assigns a priority to tasks including writes of host write data by the data type. Priority is a function of the data type from the file priority tag sorter. A performance adjustor adjusts the priority of tasks. A target assignor sorts host write data based on the data type generated by the file priority tag sorter.

A transaction system logs events indicating start and completion of data writes to the flash memory. A flush manager flushes data stored in a host DRAM to a SSD DRAM and then to a flash memory of a flash drive system when power is lost. A resume manager reloader fetches flushed data from the flash memory of the flash drive system and then to the host DRAM when power is restored. A disk miniport driver manages vendor-specific functions of the flash drive system. Smart data monitor 246, power/cpu monitor 248, and security 244 are optional.

Figure 3:
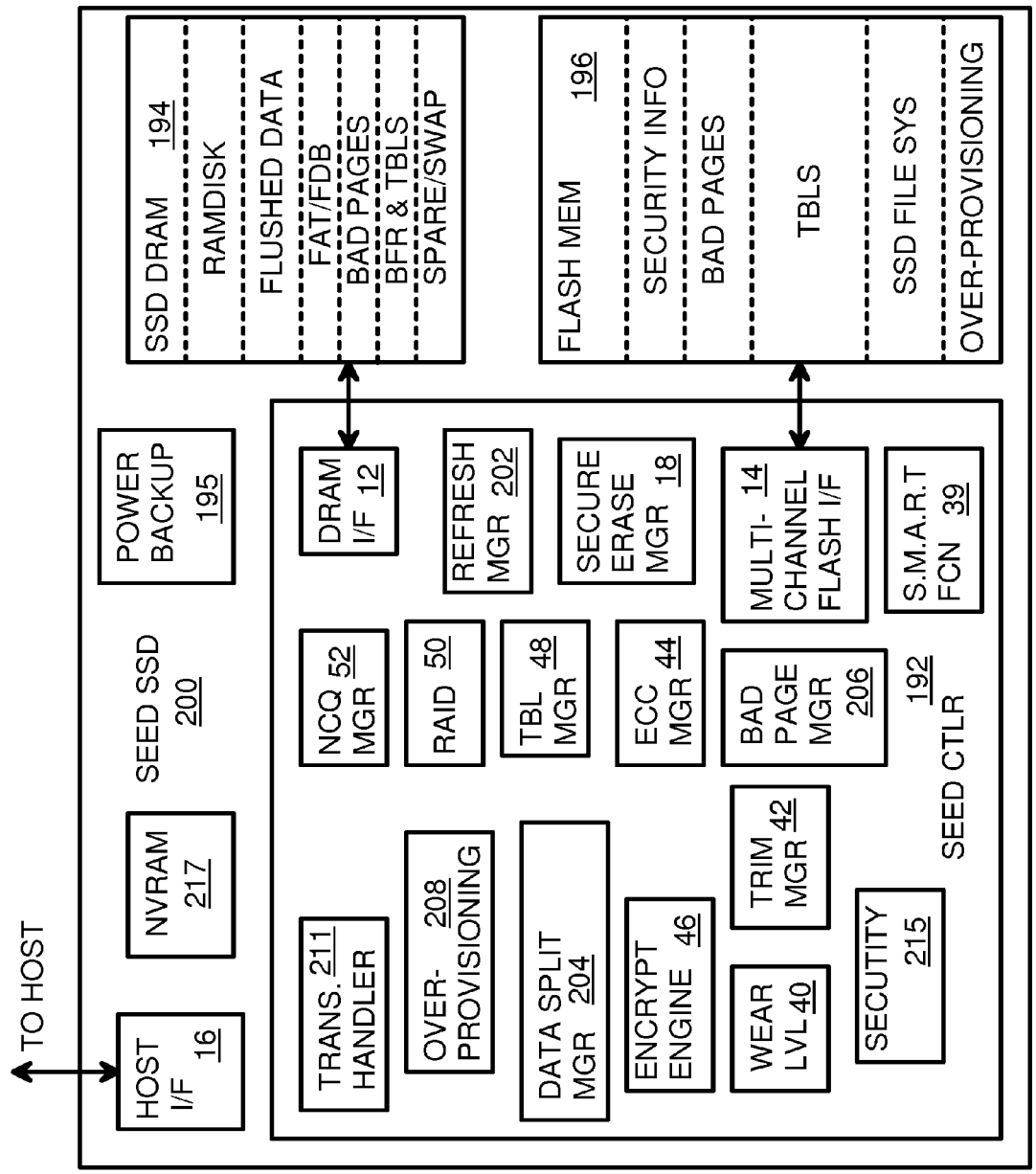
FIG. 3 is a block diagram of a Super Enhanced Endurance Device (SEED).

FIG. 3 is a block diagram of a Super Enhanced Endurance Device (SEED). SEED 200 has host interface 16, which communicates with host 300 (FIG. 1) using a bus such as a PCIe, SATA, mini-SATA, SATA express, Universal-Serial-Bus (USB), Next-Generation Form Factor (NGFF), Parallel ATA, IDE, NVMe, Thunderbolt, eMMC, iSSD, SD, etc. Host data from host interface 16 is sent to SEED controller 192. SEED controller 192 performs a variety of functions to reduce the wear of NAND flash memory 196, such as by storing flushed files from GNSD driver 100 in host 300 in SSD DRAM buffer 194 and not in NAND flash memory 196.

SSD DRAM buffer 194 may store backups of host DRAM and other data or tables flushed from GNSD driver 100. It may also store other data including meta-data, spare and swap blocks, tables for bad page management, and other buffers and tables.

NAND flash memory 196 may store security information, tables, the file system for the SSD, and various other tables and buffers, in addition to user data and flushed DRAM. Some areas of NAND flash memory 196 may be reserved for bad blocks or for over-provisioning.

DRAM interface 12 reads and writes data in SSD DRAM buffer 194 while multi-channel flash interface 14 reads pages, programs data pages, and erases blocks in NAND flash memory 196, which may be organized into several channels. Native Command Queue (NCQ) manager 52 may re-order host commands from host 300 and manage a queue of host commands received through host interface 16. The manager loads host commands into a command queue where writes are re-ordered and combined to reduce flash writes.

RAID controller 50 writes new data across several channels of NAND flash memory 196 and may replicate data to provide redundancy and data recovery. ECC manager 44 generates error-correction code (ECC) to attach to write data, and compares stored ECC to re-generated ECC to detect and correct errors on reads. It also manages pages of flash that need extra ECC protection, generating ECC for those pages, and managing storage and retrieval of the ECC data when needed. Instead of performing EC, ECC manager 44 can be used for LDPC. Bad page manager 206 keeps track of all locations of page status in NAND flash memory 196. This can extend the lifetime of individual blocks, since only one page may be bad in the block, and other pages may continue to be used. More complex bad-block management may reduce the overall wear of the flash drive.

Wear-leveler 40 may provide two methods of wear leveling methods. One method is to dynamically choose the lowest wear leveling count block from the available empty blocks to write data to. The other method is based on a wear leveling count threshold. Once this threshold is reached, blocks of flash data are moved from one physical block (with a low wear leveling count) to another empty physical block (with a high wear leveling count) in NAND flash memory 196. Updates are made to the logical-to-physical mapping in mapping tables that are managed by table manager 48. Table manager 48 also tracks the type of data that is stored in each logical block or page so that temp files, paging files, FAT, FDB, and user data files are tracked once identified and categorized by data split manager 204. Alternatively, the host can pass the data type information through vendor commands to the SEED SSD so data split manager 204 doesn't duplicate the work done by GNSD driver 100. Alternately, this function can be optionally disabled for certain situations.

Encryption engine 46 performs encryption of write data and decrypts read data if the function is not done by GNSD driver 100. TRIM manager 42 processes a TRIM command from the file system or OS on host 300. The TRIM command indicates that a sector is no longer needed by the host and can be wiped or erased. The trimmed page is marked in the page status table as a garbage page as '100*b*' or '101*b*'. When doing background garbage collection, if that block is identified as an erase candidate, this page is not be copied to a new block. At that time the TRIM command is completed. TRIM manager 42 performs overhead such as keeping track of which sectors and pages in a block are no longer needed. A garbage collector may also be used to track blocks that are ready for erasing. Once an entire block is no longer needed, TRIM manager 42 activates the garbage collector or other erase mechanism to erased the block so that the block may be re-used.

S.M.A.R.T. function 39 processes S.M.A.R.T. commands or vendor commands from host 300, such as to monitor and control error correction, wear, bad block, and other flash memory management. S.M.A.R.T. stands for Self-Monitoring, Analysis and Reporting Technology. The host can use the S.M.A.R.T. command sets to monitor some important data from the SSD device such as power on time, wear-leveling count, etc. The Host can use this data to diagnoses and identify the life expectancy of the SSD. It can also use the information to determine the warranty coverage based on the usage. The host can replace the SSD drive before it experiences a real casualty. In RAID, the host can use S.M.A.R.T. commands to avoid a more expensive RAID 5 configuration.

Transaction manager 211 ensures that data is completely written or transferred to the NAND flash. Over-provisioning 208 sets aside and manages spare blocks in NAND flash memory 196. Security 215 may perform a password verification process before allowing access to the secure partition of NAND flash memory 196. The partition can be the whole drive or a part of the drive.

Refresh manager 202 may periodically (such as daily or weekly) refresh data in NAND flash memory 196. Routines such as that shown in FIG. 13 may be performed by refresh manager 202 and other components. Secure erase manager 18 performs a higher-security erase operation such as writing all zeros or all ones to a block to remove data when required.

Power backup 195 provides backup power so that SEED 200 may write data from SSD DRAM buffer 194 to NAND flash memory 196 when power fails. NVRAM 217 provides more non-volatile storage for critical meta data information, such as for transaction logs, meta data, and configuration information.

Figure 4:
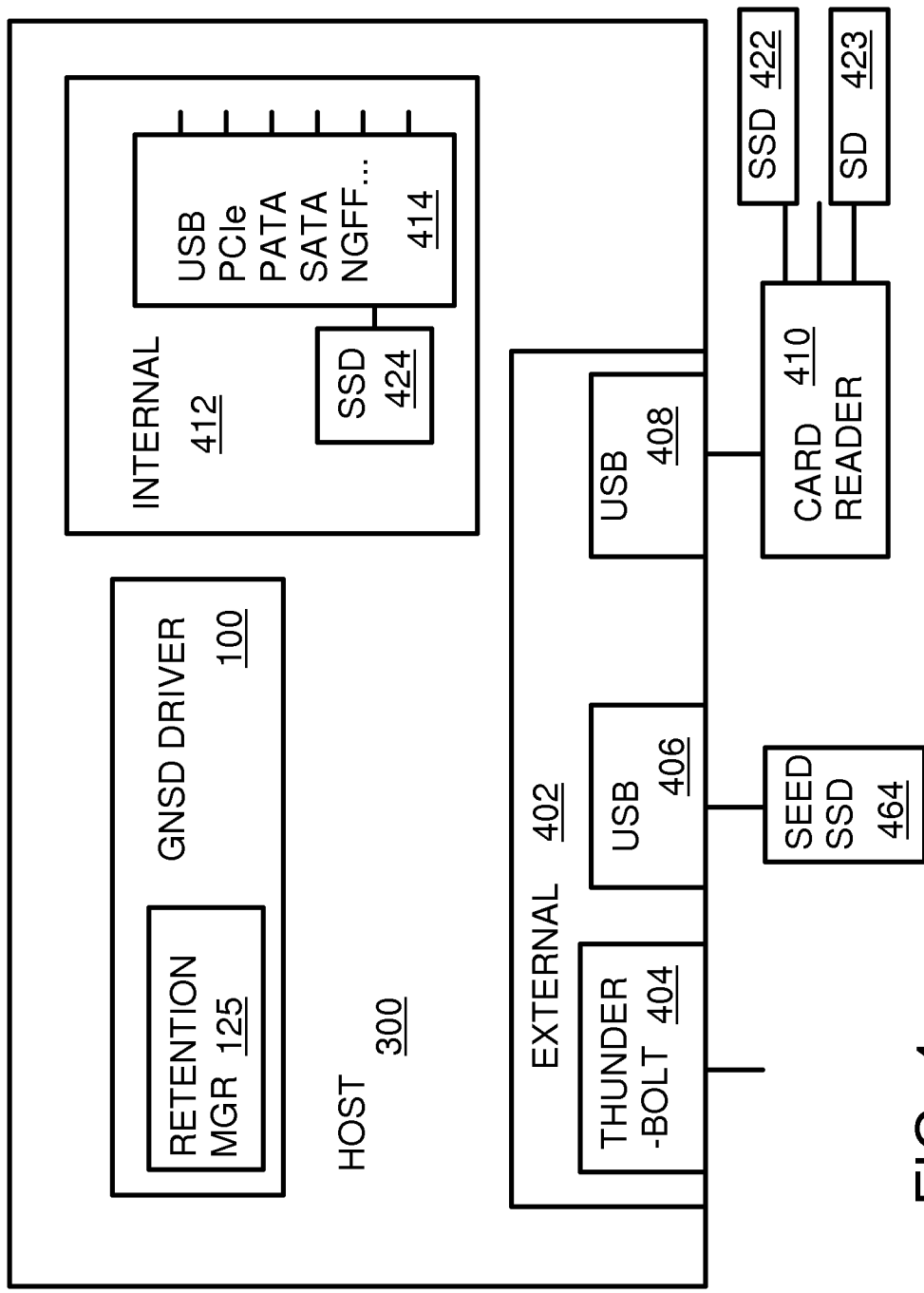
FIG. 4 is a block diagram of a host with attached SSD and SEED devices with a retention manager in the GNSD driver for refreshing flash data.

FIG. 4 is a block diagram of a host with attached SSD and SEED devices with a retention manager in the GNSD driver for refreshing flash data. Host 300 has both internal interfaces 412 and external interfaces 402 to peripherals such as SSD's. Internal SSD 424 connects to internal ports 414 in internal interfaces 412, Internal SSD 424 can be mounted to the host motherboard or within the host chassis.

External SEED SSD 464 connects to USB ports 406 in external interfaces 402, while another USB port 408 has card reader 410 attached. Card reader 410 connects to external SEED SSD 422 and to external SD 423, which are removable by the user.

Internal interfaces 412 and external interfaces 402 can include PCIe, SATA, mini-SATA, SATA express, Universal-Serial-Bus (USB), Next-Generation Form Factor (NGFF) M.2, Parallel ATA, IDE, NVMe, Thunderbolt, eMMC, iSSD, SD, etc. Multiple ports and multiple connectors may be available for various bus protocols.

Retention manager 125 in GNSD driver 100 periodically causes the data in internal SSD 424, external SEED SSD 464, external SSD 422, and external SD 423 to be refreshed. More intelligent peripherals such as SEED SSD 464 may be sent a command to perform a retention operation. Other less-intelligent peripherals such as SSD 422, 424 may be refreshed by GNSD manager instructing the SSD to move blocks of data. Retention manager 125 may need to track when each block was last written to determine when to move a data block to retain its data before the data is lost. Various routines are shown in FIGS. 10-22 to retain data.

Figure 5:
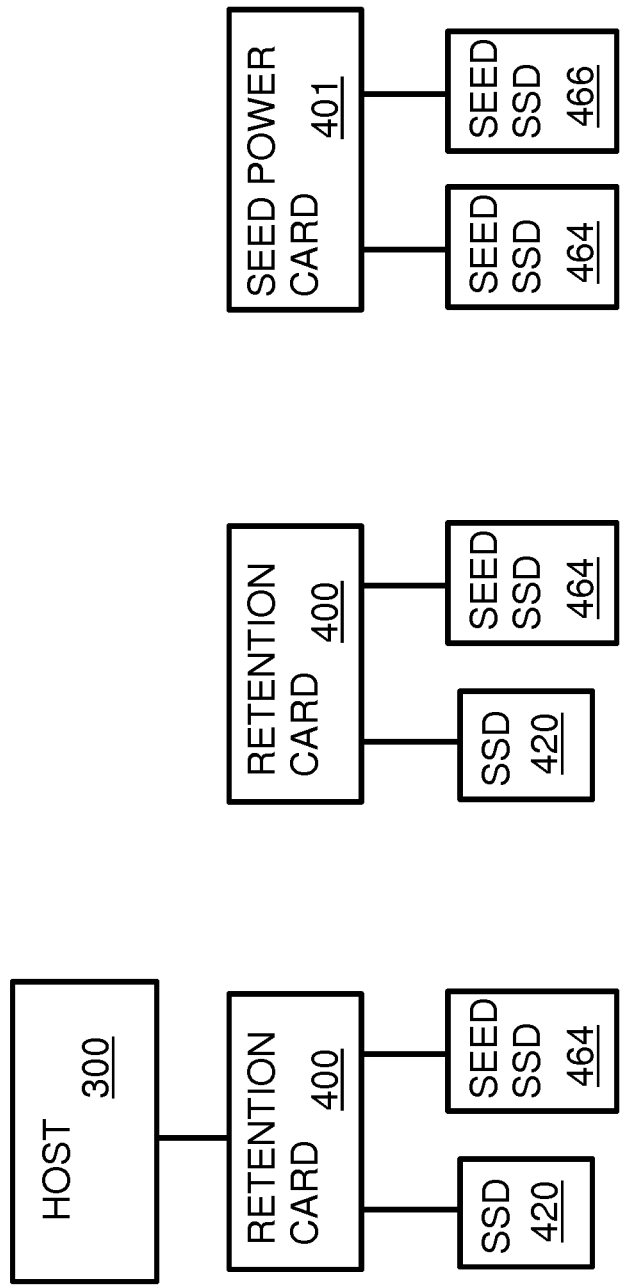
FIGS. 5A-C show hosted and disconnected SSD and SEED devices.

FIGS. 5A-C show hosted and disconnected SSD and SEED devices. In FIG. 5A, host 300 is attached to SSD 420 and SEED SSD 464 through retention card 400. Retention card 400 passes signals from host 300 through to SSD 420 and SEED SSD 464. Retention card 400 can plug into an external port of host 300, such as USB port 406.

In FIG. 5B, host 300 has been disconnected from retention card 400. Retention card 400 may have been removed from host 300, or host 300 may have entered a power-down or low-power state. Retention card 400 contains a controller to refresh the data stored in SSD 420 to instruct SEED SSD 464 to perform a retention operation. Thus Retention card 400 ensures that flash data is retained for attached flash-memory devices.

In FIG. 5C, SEED power card 401 is connected to SEED SSD 464, 466. SEED power card 401 does not have an intelligent controller as did retention card 400, so SEED power card 401 is not able to refresh data in SSD 420 if it were attached. However, SEED power card 401 is able to provide power to SEED SSD 464, 466 and detect the existence of a SSD attached to it. SEED SSD 464, 466 can execute internal routines using their SEED controller 192 (FIG. 3). For example, SEED SSD 464, 466 may periodically execute a retention routine to refresh flash data.

Thus using retention card 400 or SEED power card 401, flash data may be refreshed even when host 300 is not attached or not running GNSD driver 100.

Figure 6:
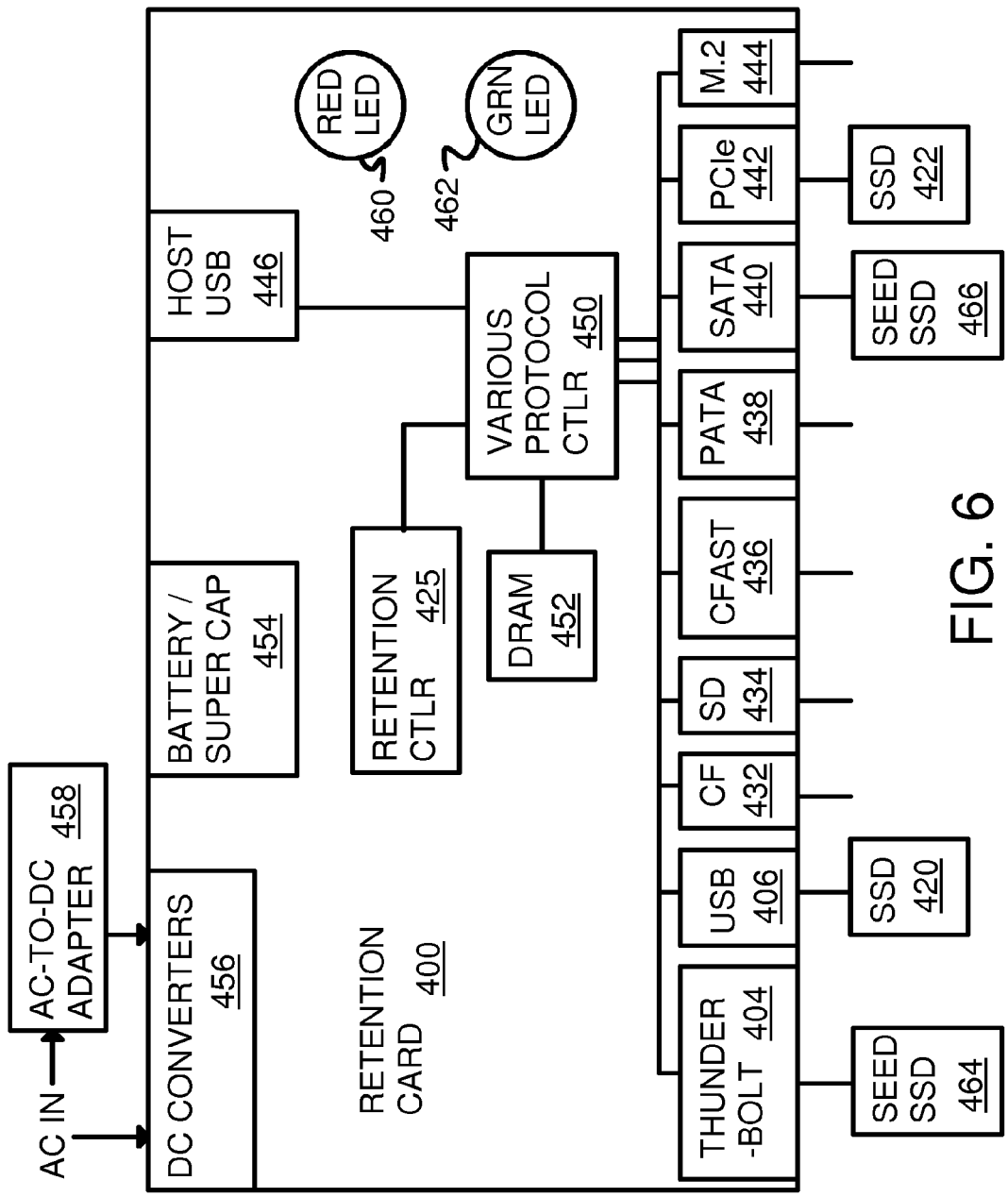
FIG. 6 shows a flash-data retention card.

FIG. 6 shows a flash-data retention card. Retention card 400 may be connected to a host through host USB port 446, but retention card 400 ensures that flash data is retained in attached storage devices such as SSD 420, 422 or SEED SSD 464, 466. Retention controller 425 periodically moves blocks in SSD 420, 422 to refresh its flash data, using routines such as shown in FIGS. 17, 19, 20.

Figure 12:
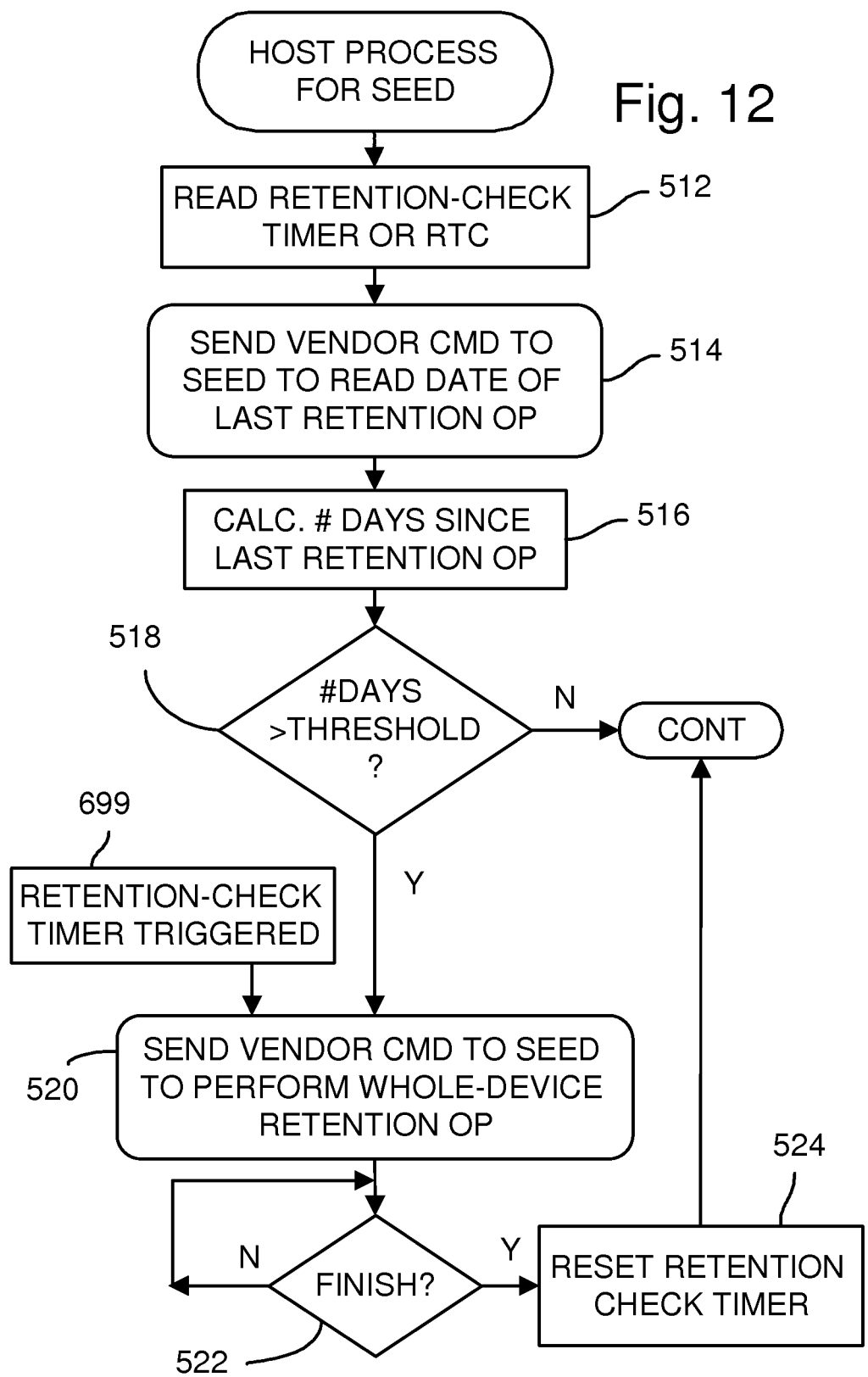
FIG. 12 is a flowchart of a host whole-device retention process when a SEED is attached.
Figure 14B:
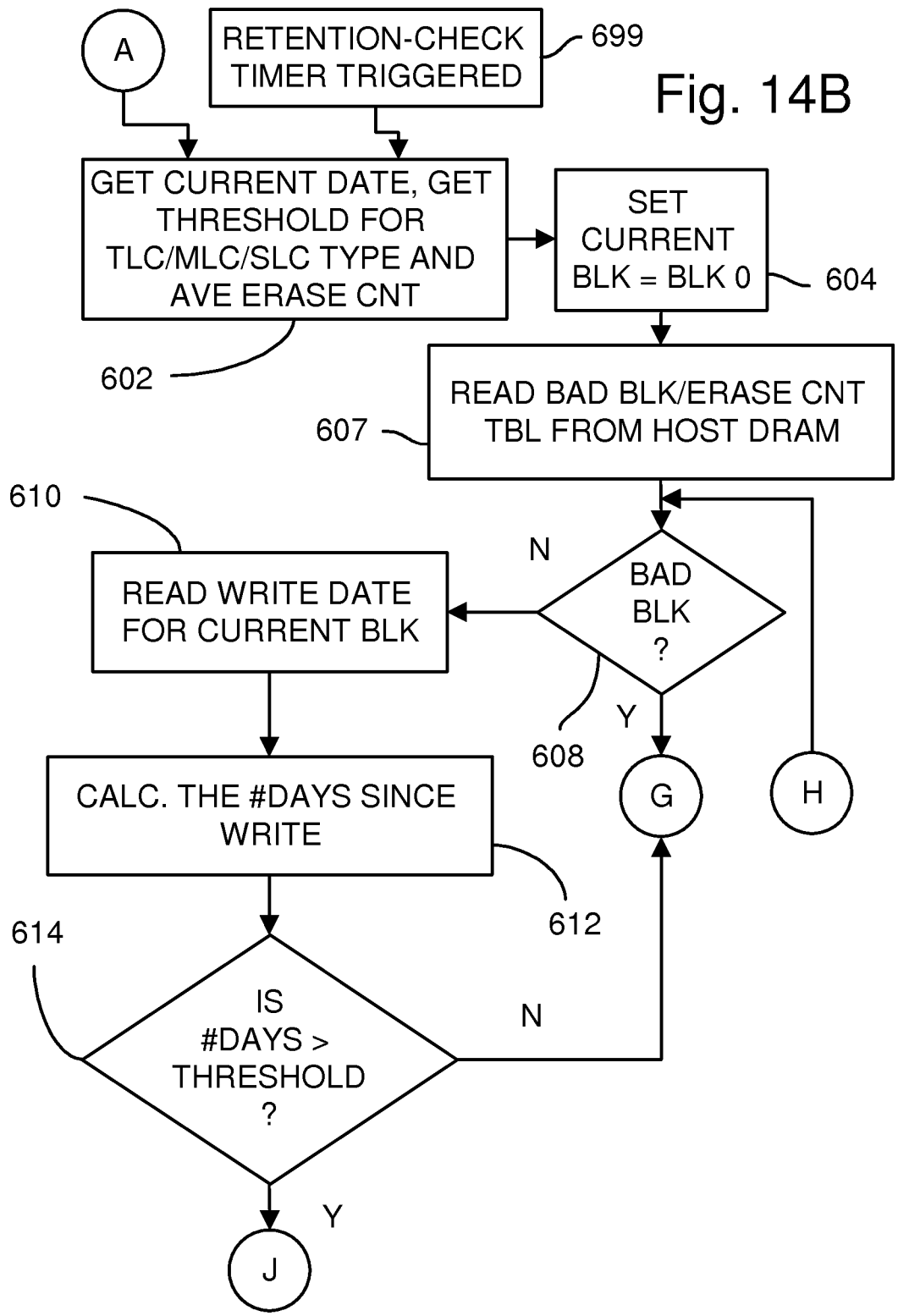
Figure 14C:
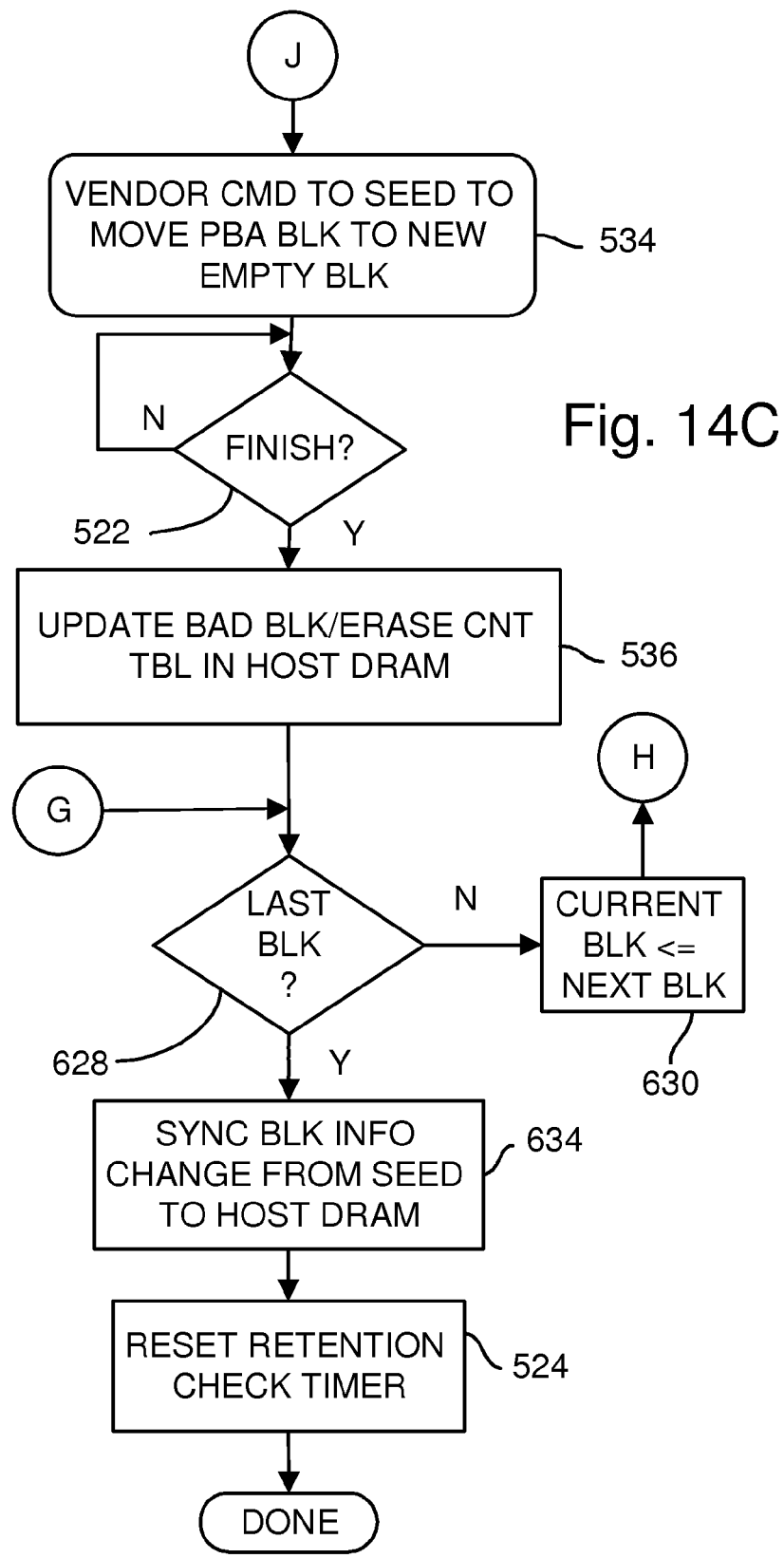
Figure 15:
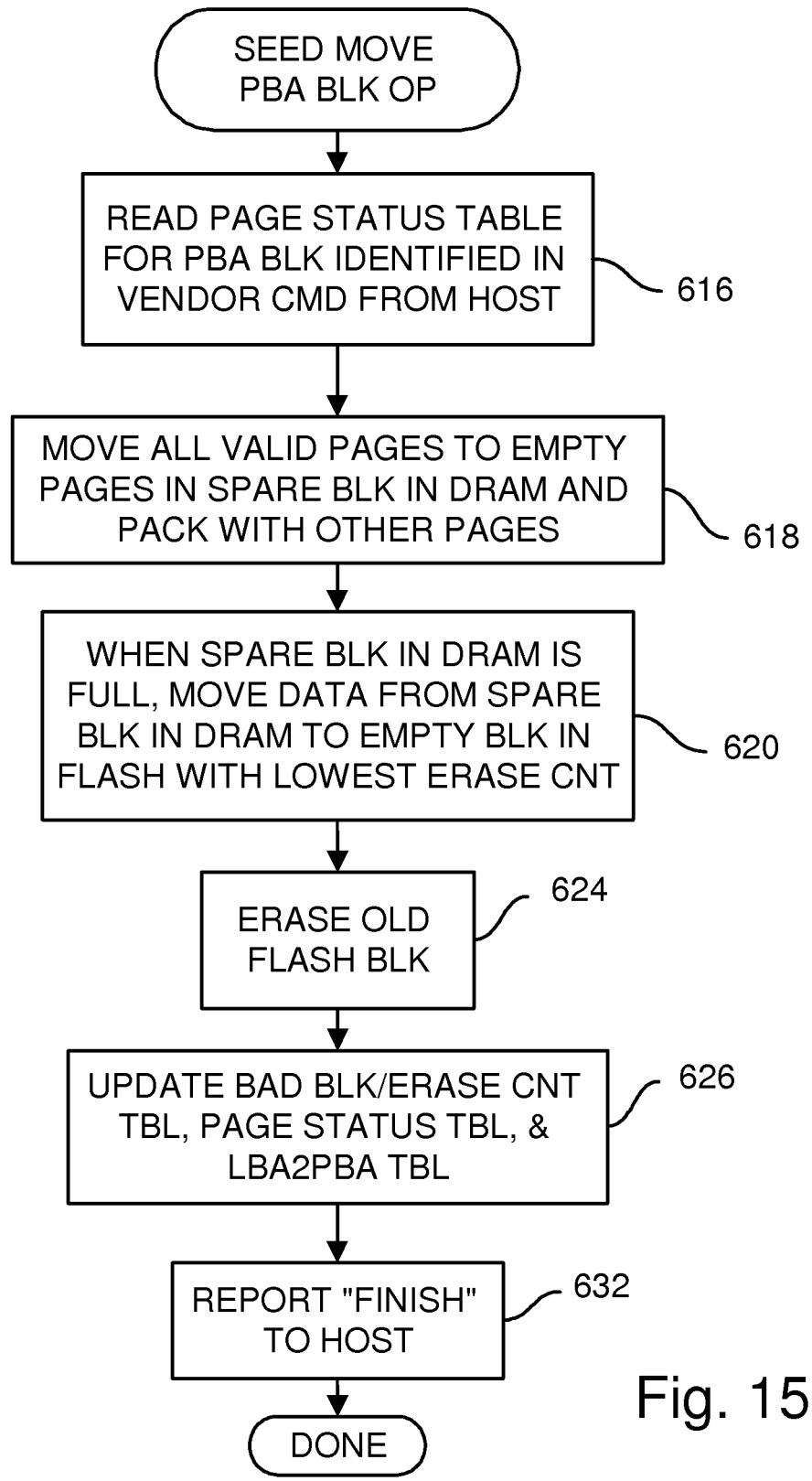
FIG. 15 shows a SEED physical block move operation.

Retention controller 425 also periodically executes a routine such as those in FIGS. 12, 14, 16 to send a high-level retention command to SEED SSD 464, 466 that causes them to internally execute a retention operation, such as shown in FIG. 13, or that causes a physical block to be moved using the routine of FIG. 15. Physical blocks may be tracked by retention controller 425 such as by storing write-dates of blocks in tables in DRAM 452, or a whole-device may be refreshed without block tracking.

Protocol controller 450 converts between the various protocols. SSD 420, 422 and SEED SSD 464, 466 may be connected to any of a variety of ports, such as thunderbolt port 404, USB port 406, CF port 432, SD port 434, CFAST port 436, PATA port 438, SATA port 440, PCIe port 442, and M.2 port 444, and others.

Protocol controller 450 can flash green LED 462 when an operation is being performed by one of the attached flash devices, or remain steady when power is available but no operation is occurring. Red LED 460 may be lit when power fails or flashing when power is low. Other kinds of indicators other than Light-Emitting Diodes (LED) may be substituted, and other indications used.

Power can be provided by the host, or by DC converters 456 or AC-to-DC adapter 458. Battery or super capacitor 454 may also provide a backup supply of energy to retention card 400. Alternately, if firmware of retention card 400 needs to be updated, the host can send new firmware thru host USB port 446.

Figure 7:
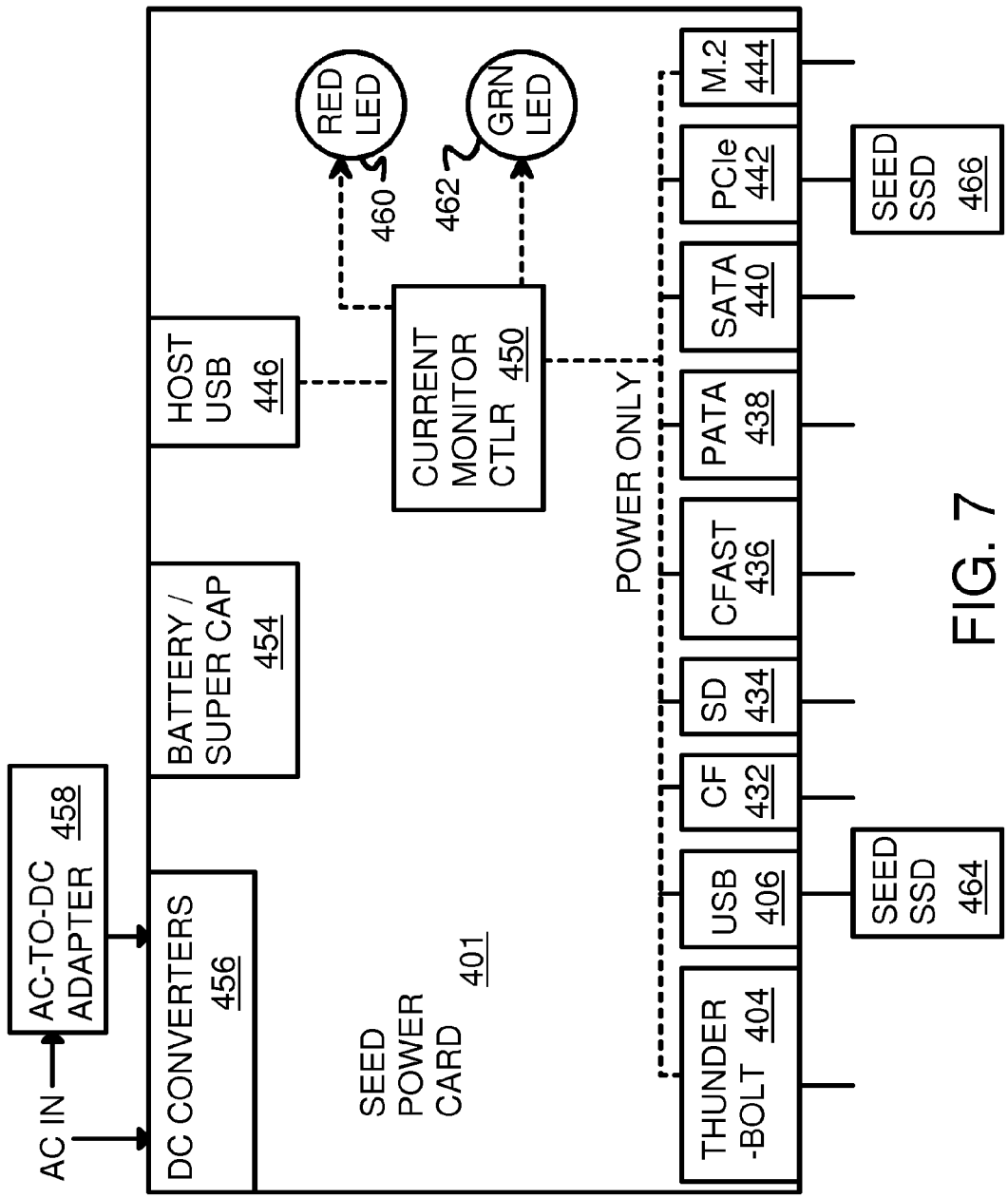
FIG. 7 shows a SEED power card.

FIG. 7 shows a SEED power card. SEED power card 401 is similar to retention card 400, but has less functionality. Controller 450 does not perform protocol conversion but merely monitor power from ports 404, 406, 434, 434, 436, 438, 440, 442, 444, 446. Alternately, the controller can monitor the presence of flash devices thru mechanical detection of card insertion. When controller 450 detects a power drain from an attached SEED SSD 464, 466, controller 450 can flash green LED 462 to indicate that an operation is being performed by one of the attached flash devices. Green LED can remain steady when power is available but no operation is occurring. Red LED 460 may be lit when power fails or flashing when power is low.

Since SEED SSD 464, 466 have internal controllers that can perform retention operation, flash data can be retained when only power is applied to SEED SSD 464, 466 by SEED power card 401. A standard SSD 420 would not be refreshed by SEED power card 401. Power can be provided by the host, or by DC converters 456 or AC-to-DC adapter 458. Battery or super capacitor 454 may also provide a backup supply of energy to SEED power card 401. Alternately, if firmware of SEED power card 401 needs to be updated, the host can send new firmware thru the host USB port 446.

Figure 8:
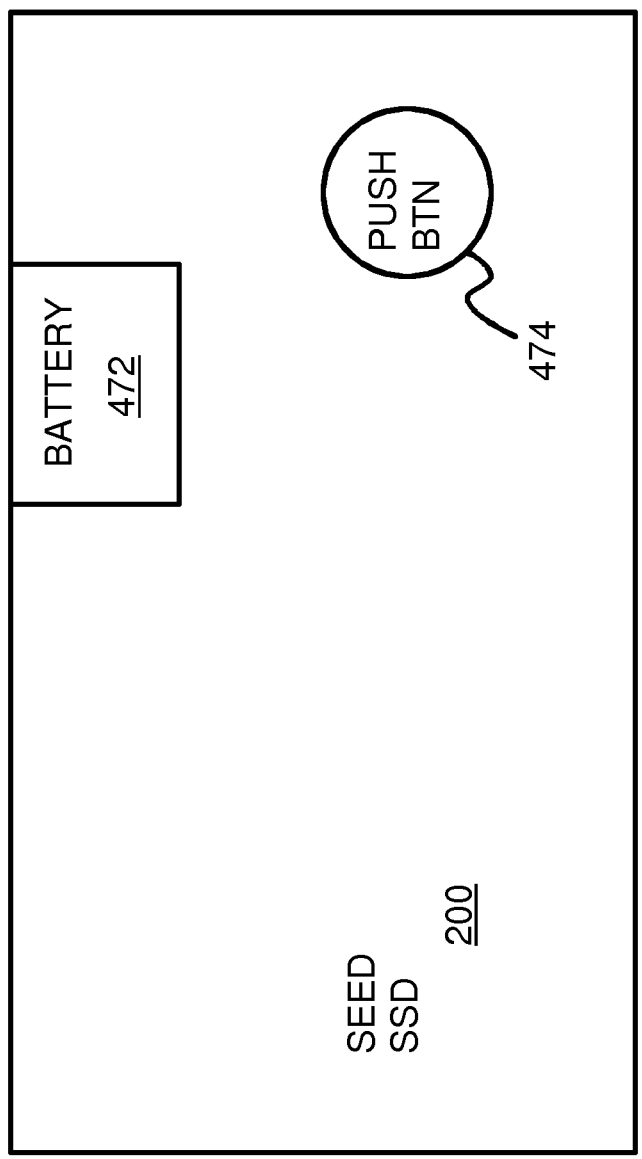
FIG. 8 shows a SEED SSD with a push-button refresh.

FIG. 8 shows a SEED SSD with a push-button refresh. Battery 472 provides power to SEED 200 when SEED 200 is not connected to host 300 or to retention card 400 or to SEED power card 401. When an end-user pushed push button 474, SEED 200 performs a retention operation, such as the routines shown in FIGS. 13, 22. Thus the end-user may force a refresh of flash data at any time.

FIGS. 9A-B show bad block/erase count tables and page status tables. In FIG. 9A, a write date is stored on a block basis. Bad block/erase count table 471 has entries for blocks of flash memory. Each entry contains a block status field, with 3 bits that indicate if the block is empty (erased), used, a block with some garbage pages, a whole bad block, or a partially bad block with some bad pages and some good pages.

Each block entry also has a 13-bit erase count and a 16-bit write date. The 13-bit erase count starts at 0 when the device is first produced. Every time the block is erased it increments by one. This erase count can be used for wear leveling control and can be analyze by the S.M.A.R.T. for checking the health condition of the device. The write date is the date that the last write to the block occurred. It is used for the purpose of the refresh function. For TLC devices the retention time may be less than 1 year. The write date may be an encoded data (MM-DD-YY), or a number value that refers to the device manufacturing date initialized at manufacture.

Page status table 473 has entries for all pages in a block. Each page has a 3-bit page status field. Since each page entry is only 3 bits long, many page entries may be packed together. The page status indicates an empty, used, or garage page, a bad page, or a page that is protected with a higher level of error correction, such as a longer ECC code than for other pages.

FIG. 9B, a write date is stored on a page basis rather than on a block basis. Bad block/erase count table 471' has entries for blocks of flash memory. Each entry contains a 13-bit erase counter and a block status field, with 3 bits that indicate if the block is empty (erased), used, a block with some garbage pages, a whole bad block, or a partially bad block with some bad pages and some good pages.

The write date is not stored in bad block/erase count table 471'. Instead, the write date is stored in page status table 473'. The write date is the date the page is written for FIG. 9B, but the date the block is written for FIG. 9A. Storing the write data for pages rather than for blocks requires more table storage since each block has many pages, but endurance may be increased. This refresh is for pages, not for the whole block.

Figure 10:
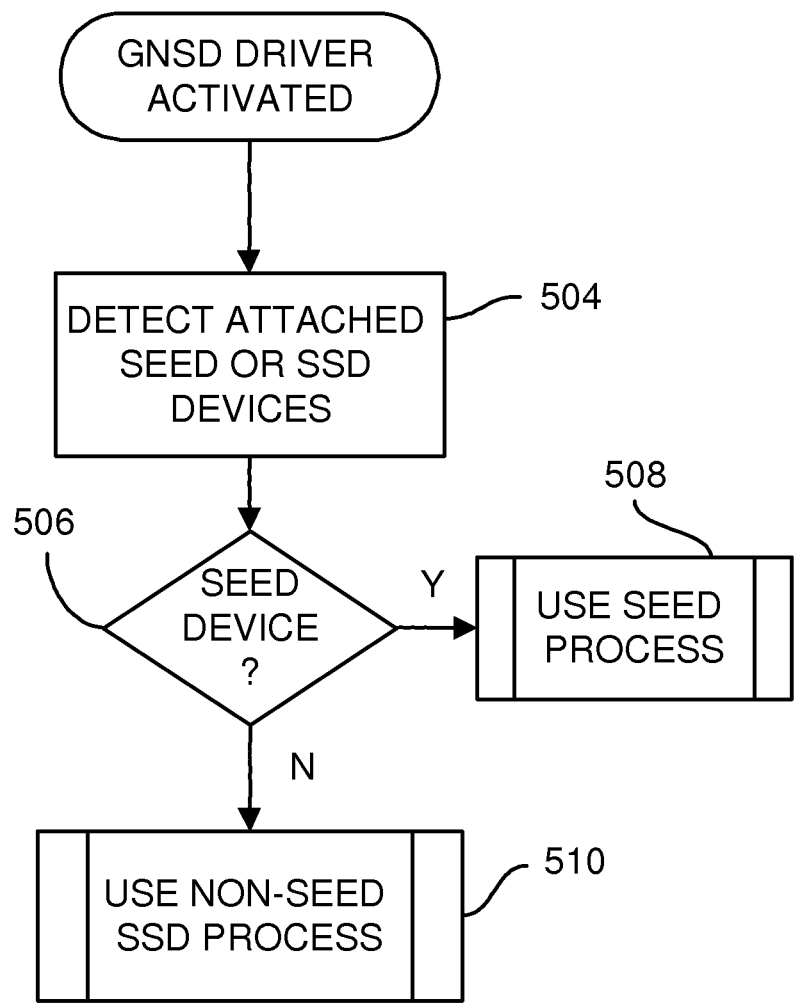
FIG. 10 is a flowchart of a GNSD driver on a host identifying attached flash devices.

FIG. 10 is a flowchart of a GNSD driver on a host identifying attached flash devices. When the GNSD driver is activated on the host, such as at initialization, the host detects all attached flash devices, step 504. The attached devices may be intelligent SEED flash devices or standard SSD flash devices. SEED devices have additional functionality that may facilitate various kinds of retention operations.

When a SEED device is detected, step 506, the host GNSD driver executes a SEED process, step 508, when performing retention. When a non-SEED device is detected, step 508, then the host GNSD driver executes a non-SEED SSD process for retention, step 510. Retention operations to refresh flash memory may rely heavily on the host for non-SEED SSD's but use little host resources when a SEED is attached, since the SEED contains local resources to perform and track refresh operations.

If both SEED and non-SEED devices are attached, the host may perform both SEED and non-SEED SSD processes. Processes may be adjusted for multiple same-kind devices.

Figure 11:
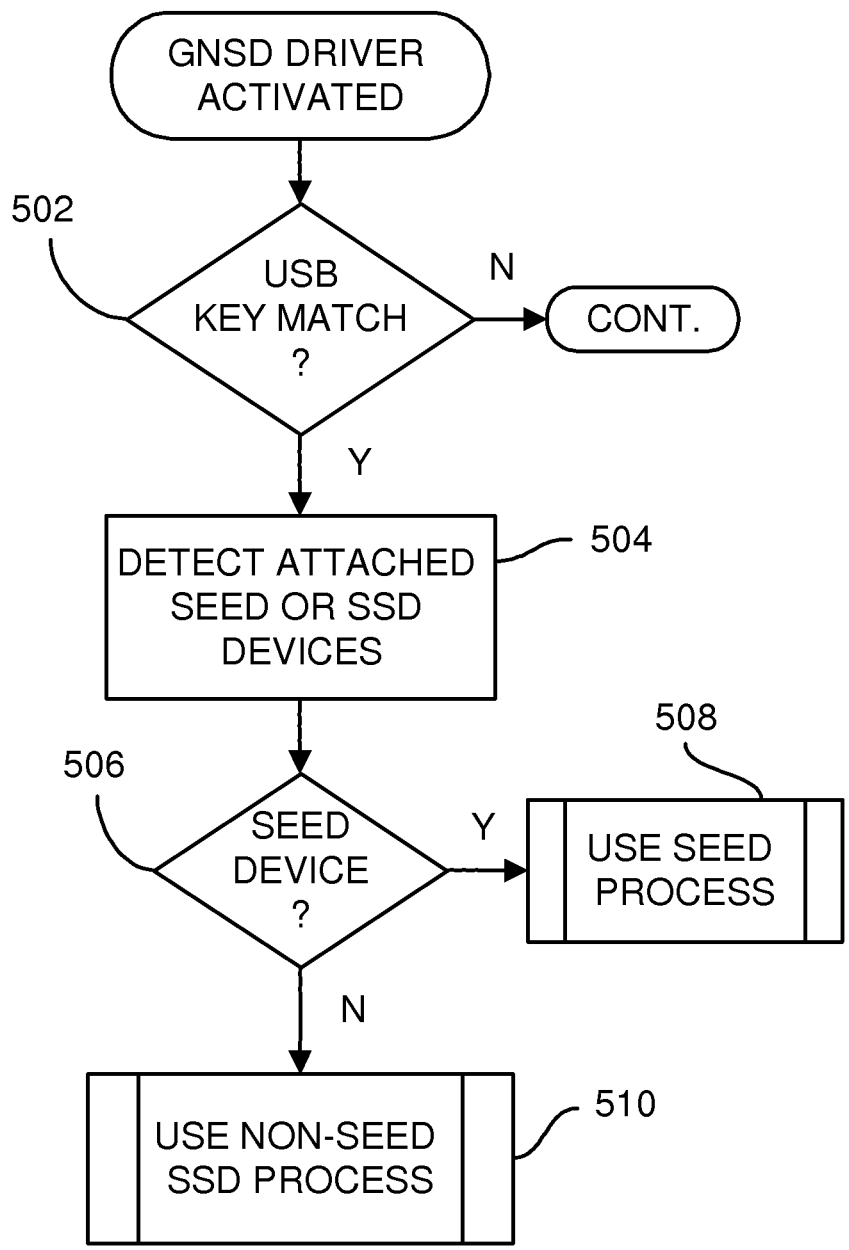
FIG. 11 is a flowchart of a GNSD driver on a host identifying a USB key which enables the GNSD driver retention function.

FIG. 11 is a flowchart of a GNSD driver on a host identifying secure attached flash devices. A USB security key must be attached to the host before the host can access the attached flash devices. If the USB key is not attached, or does not match the security key, step 502, then the GNSD driver is prevented from accessing the any attached SEED or SSD. Otherwise, the routine is as described for FIG. 10.

FIG. 12 is a flowchart of a host whole-device retention process when a SEED is attached. In this embodiment, all blocks write date in the SEED are checked and refreshed if the block's write date is larger than the threshold. A single vendor command is used. The SEED is an intelligent flash device that accepts higher-level vendor commands from the host.

The host routine starts with setup and reset of a retention-check timer or a Real-Time-Clock (RTC), step 512. The retention-check timer is controlled by a user selection to setup the period of time the retention routine is executed such as weekly (1 week=7 days=168 hours=10080 minutes=604800 seconds). The host then sends a vendor command to the SEED to read the date of the last retention operation by that SEED, step 514. The host calculates the number of days since the last retention operation by that SEED, step 516, such as by obtaining the difference between the host 300 current date and the date from the SEED. Steps 512, 514, and 516 execute only once at the beginning of the program.

When the number of days since the last retention operation exceeds a retention-check threshold, step 518, or when the retention-check timer is triggered, step 699, the host sends a vendor command to the SEED commanding the SEED to perform a whole-device retention operation, step 520. This operation performed by the SEED is shown in more detail in FIG. 13A-B. Once the SEED reports it is finished to the host, step 522, the host can reset its retention check timer, step 524 and the retention operation will wait another week when the retention-check timer triggered.

There are two thresholds. The retention-check threshold is the period of time between retention processes. Another threshold is triggered when the flash data was written into the flash block has almost reached its guaranteed retention time.

The retention check timer can be used to directly show the number of days since the last retention operation without using steps 514, 516 if there is only one SEED attached, or of the host keeps separate retention timers for each SEED. If a SEED is detached and refreshed on another host, the retention timer may not be valid.

Figure 13A:
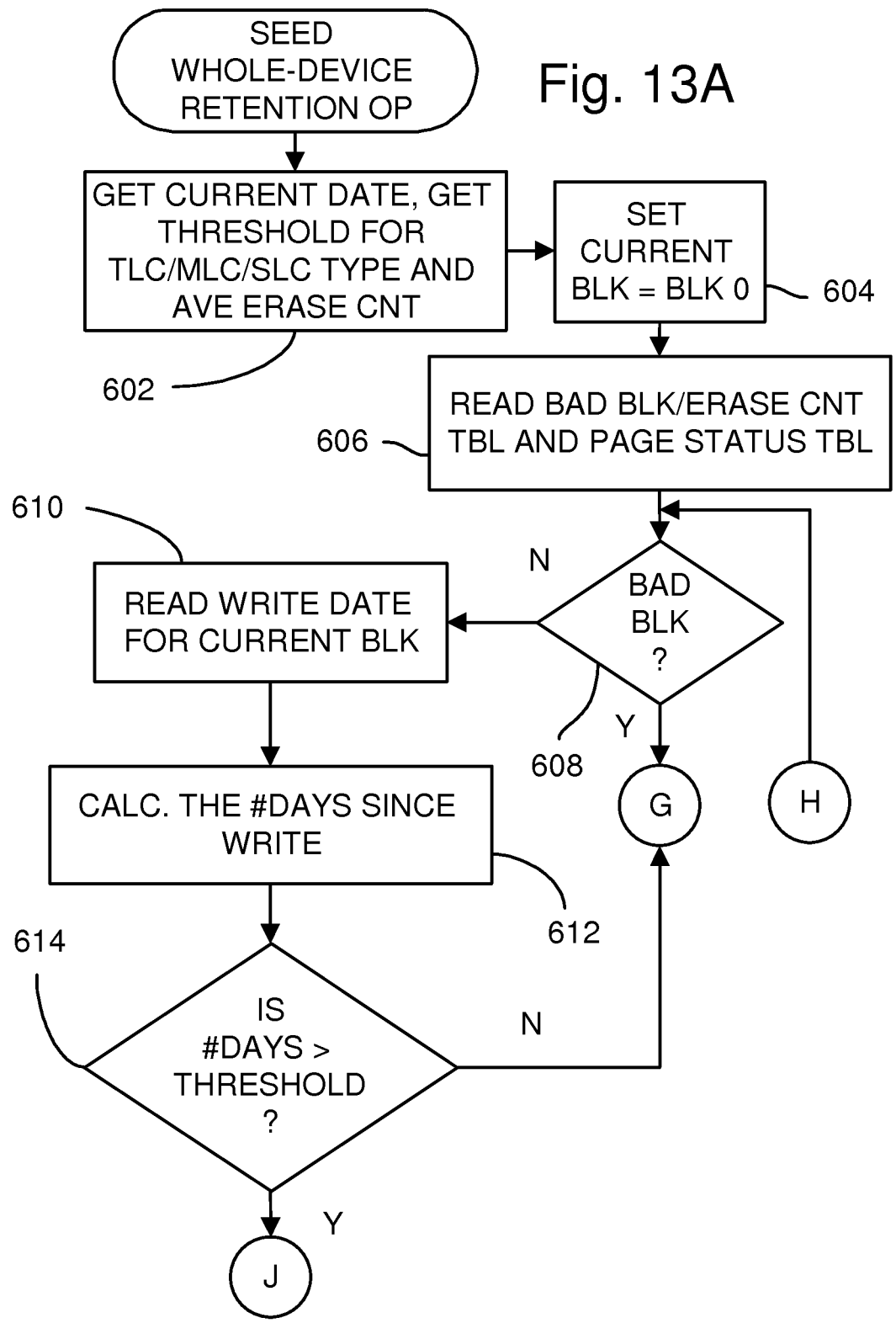
FIGS. 13A-B show a SEED whole-device retention operation using the tables in FIG. 9.
Figure 13B:
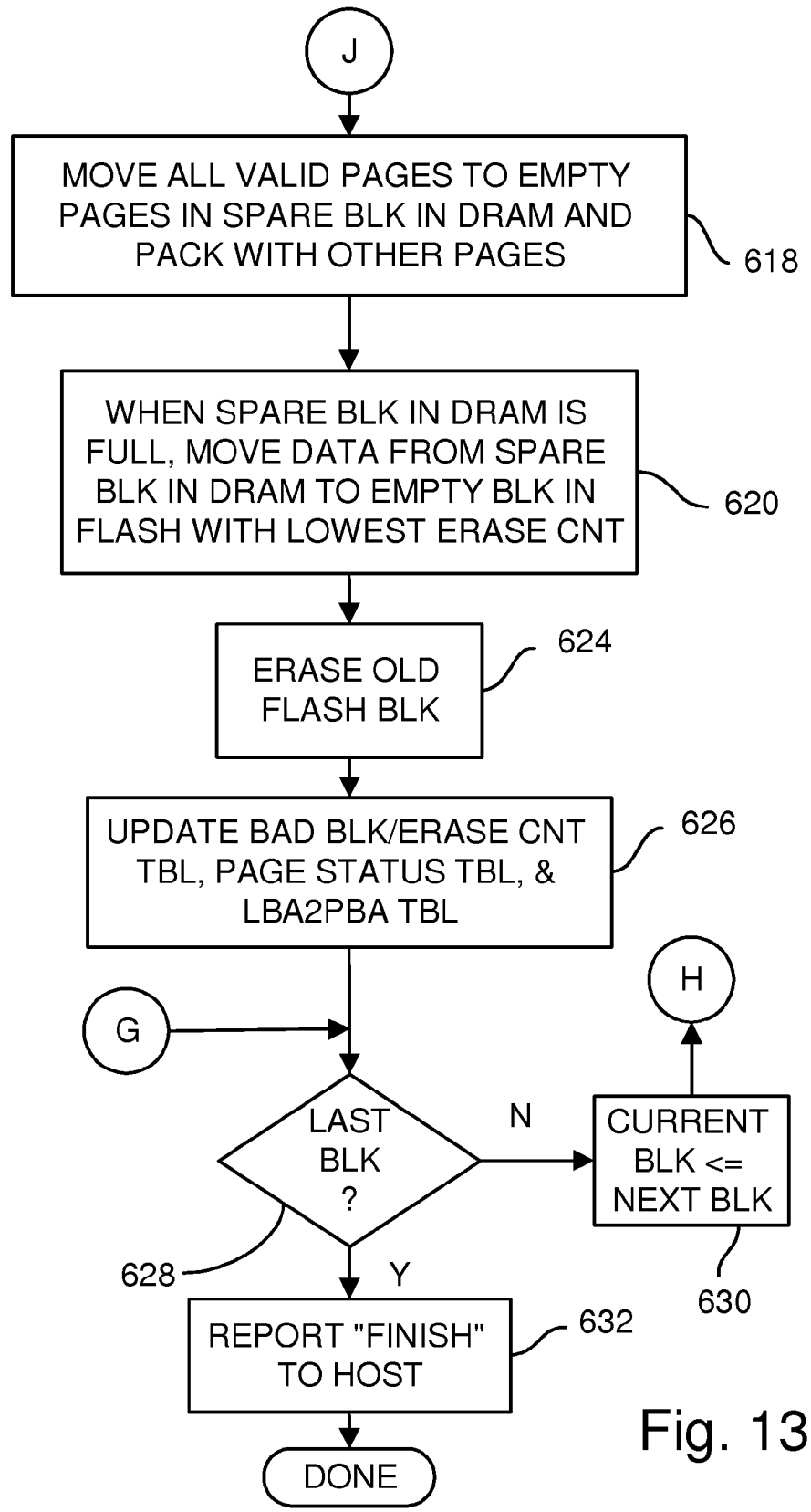

FIGS. 13A-B show a SEED whole-device retention operation using the tables in FIG. 9. When refresh is initiated by the host, such as periodically (once per week, etc.), the host sends a vendor command to the SEED to perform a whole-device retention operation. The SEED reads internally-stored tables or registers for the current date and a retention threshold, step 602. The retention threshold may be a function of the type of flash memory, such as SLC, MLC, or TLC cells, and the average erase count.

The current block is set to the first block, step 604, and the bad block/erase count table, and any page status tables are read, step 606. If the block is not a bad block, step 608, then the block write date is read from the bad block erase count table, step 610. The number of days since the last write is calculated, such as by subtracting the write date from the current date, step 612. When the number of days since the last write does not exceed the retention threshold time, step 614, or when the block is a bad block, step 608, then in FIG. 13B, if the block is not the last block, step 628, the next block is selected as the current block, step 630, and the process repeats from step 608. FIG. 13A.

When the number of days since the last write exceeds the retention threshold time, step 614, then (FIG. 13B) all valid pages in the block are moved to empty pages in a DRAM buffer for a spare block, and packed with other pages from previously refreshed blocks at step 618. When the spare block in the DRAM is full, data from the spare block in DRAM is moved to a spare block in flash with the lowest erase count, step 620. Then the old flash blocks are erased, step 624. The bad block/erase count table, page status tables, and LBA2PBA mapping tables are updated, step 626.

When there are more blocks to process, step 628, the current block is advanced to the next block, step 630. Otherwise the whole SEED has been refreshed, and the SEED device sends a message to the host that the retention operation is finished, step 632.

FIG. 14A-C is a flowchart of a host block-tracking retention process when a SEED is attached. In this embodiment, the host tracks blocks in the SEED. The host determines when to refresh each block, and then refreshes a block by sending a vendor command to move the block. The SEED in this embodiment allows the host to use the Physical Block Address (PBA) rather than logical block addresses using a vendor command.

The host routine starts with a setup and reset of a retention-check timer or a Real-Time-Clock (RTC), step 512. The retention-check timer is controlled by a user selection to setup the period of the time the retention routine is executed such as weekly. The host then sends a vendor command to the SEED to read the write dates for all physical blocks in the SEED, step 532. Other block information, such as bad blocks and block type (SLC/MLC/TLC) may also be obtained from the SEED. The bad block locations and block write dates are written to the host DRAM, step 530.

The host then sends a vendor command to the SEED to read the date of the last retention operation by that SEED, step 514. The host calculates the number of days since the last retention operation by that SEED, step 516, such as by obtaining the difference between the host 300 current date and the date from the SEED. Steps 512, 514, 530, 532 and 516 execute only once at the beginning of the program. When the number of days since the last retention operation is less than a retention-check threshold, step 518, then it is too soon to perform a retention operation, and the process ends.

When the number of days since the last retention operation exceeds a retention-check threshold, step 518, or when the retention-check timer is triggered, step 699, the process continues in FIG. 14B. The current date is obtained, such as by reading from the host, and the retention threshold is obtained. The retention threshold may be a stored or fixed value, or it may be calculated from the flash type (single, double, or triple bits per cell, etc.) and the average erase count for blocks, step 602.

The current block is set to the first block, step 604, and the bad block/erase count table, and any page status tables are read from the host DRAM buffer, step 607. If the block is not a bad block, step 608, then the block write date for the current block is read from the bad block erase count table, step 610. The number of days since the last write of this block is calculated, such as by subtracting the block write date from the current date, step 612. When the number of days since the last write does not exceed the retention threshold time, step 614, or when the block is a bad block, step 608, then in FIG. 14C, if the block is not the last block, step 628, the next block is selected as the current block, step 630, and the process repeats from step 608. FIG. 14B.

When the number of days since the last write exceeds the retention threshold time, step 614, then (FIG. 14C) the host sends a vendor command to the SEED to move the current block to a new empty block, step 534. Bad pages and garbage pages are not moved. The new empty block can be selected as the block with the lowest erase count, or based on some other criteria, or randomly from a list of empty blocks. Once the SEED reports that the move is finished, step 522, then the bad block/erase count table in the host DRAM is updated, step 536. The SEED erases the old block as part of the move operation, so the erase count of the old block is increased. The next block can be processed.

When the current block is the last block, step 628, then block information is synced from the SEED to the host DRAM, step 634. The host can reset its retention check timer, step 524 and wait for the next scheduled retention operation.

FIG. 15 shows a SEED physical block move operation. This routine is called by step 534 of FIG. 14C. The SEED reads its page status table for the physical block PBA in the vendor command received from the host, step 616. All valid pages in the PBA are moved to a spare block buffer in the SEED's internal DRAM, step 618. The spare block buffer may be packed with other pages from other blocks. When the spare block buffer is full, the spare block data is moved to an empty block in the SEED's flash, such as an empty block with a lowest erase count, step 620. The old flash block is erased or put into a garbage collection list, step 624. The SEED's bad block/erase count table, the page status table, and the LBA-to-PBA mapping tables are updated, step 626. The SEED reports a finished status to the host, step 632.

FIGS. 16A-D is a flowchart of an alternative host block-tracking retention process when a SEED is attached. In this embodiment, the host tracks blocks in the SEED, but uses lower-level SEED functions than in FIG. 14. The host determines when to refresh each block, and then refreshes a block by sending a series of vendor commands to move and erase the block. The SEED in this embodiment allows the host to use the Physical Block Address (PBA) rather than logical block addresses.

The host routine starts with a setup and reset of a retention-check timer or a Real-Time-Clock (RTC), step 512. The retention-check timer is controlled by the user selection to setup the period of the time the retention routine is executed, such as weekly. The host then sends a vendor command to the SEED to read the S/M/TLC, bad block/erase count tables, page status tables, and LBA-to-PBA mapping tables for all physical blocks in the SEED, step 533. The tables are written to the host DRAM, step 530.

The host then sends a vendor command to the SEED to read the date of the last retention operation by that SEED, step 514. The host calculates the number of days since the last retention operation by that SEED, step 516, such as by obtaining the difference between the host 300 current date and the date from the SEED. Steps 512, 514, 530, 532 and 516 execute only once at the beginning of the program. When the number of days since the last retention operation is less than a retention threshold, step 518, then it is too soon to perform a retention operation, and the process ends.

Figure 16B:
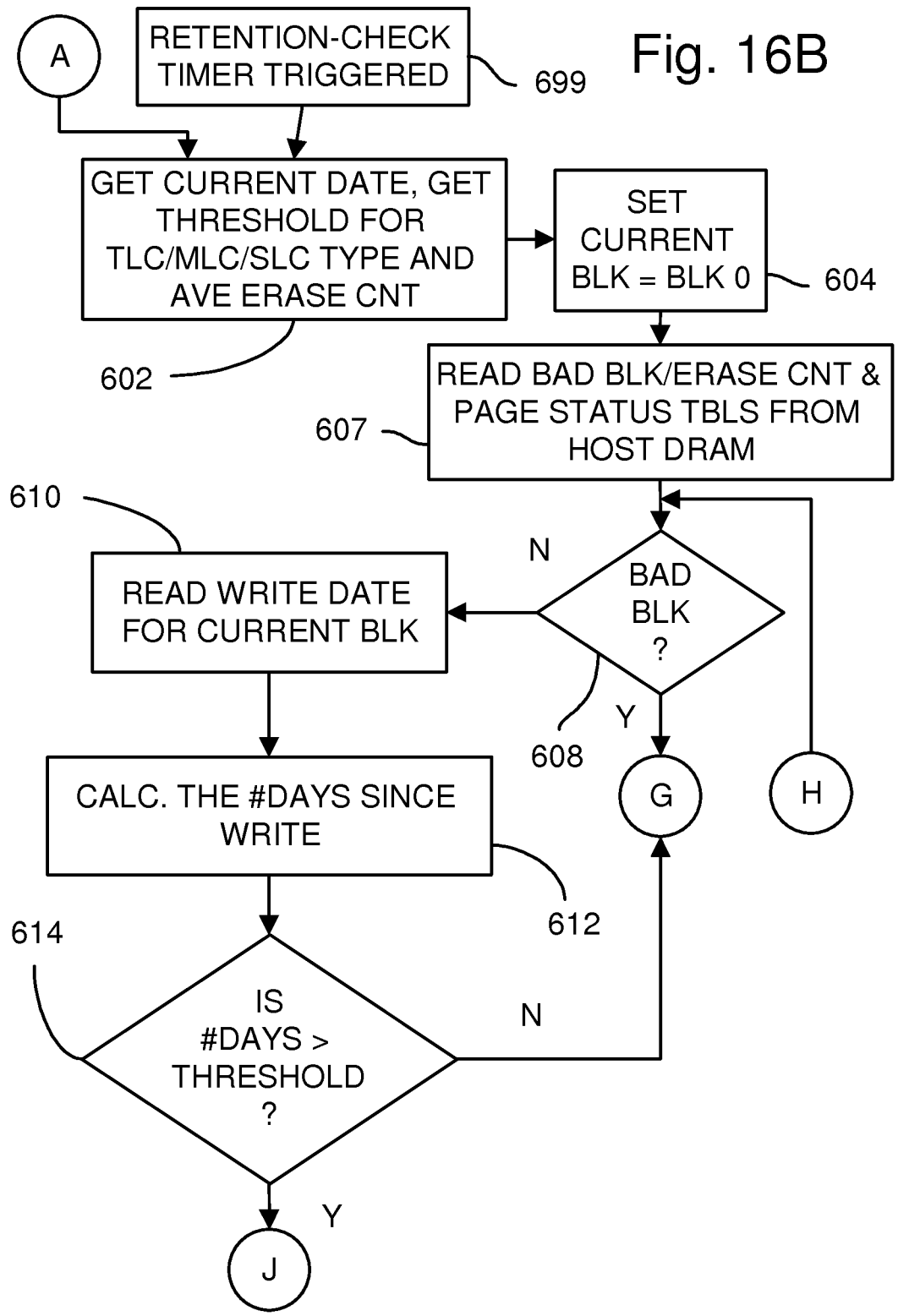
Figure 16C:
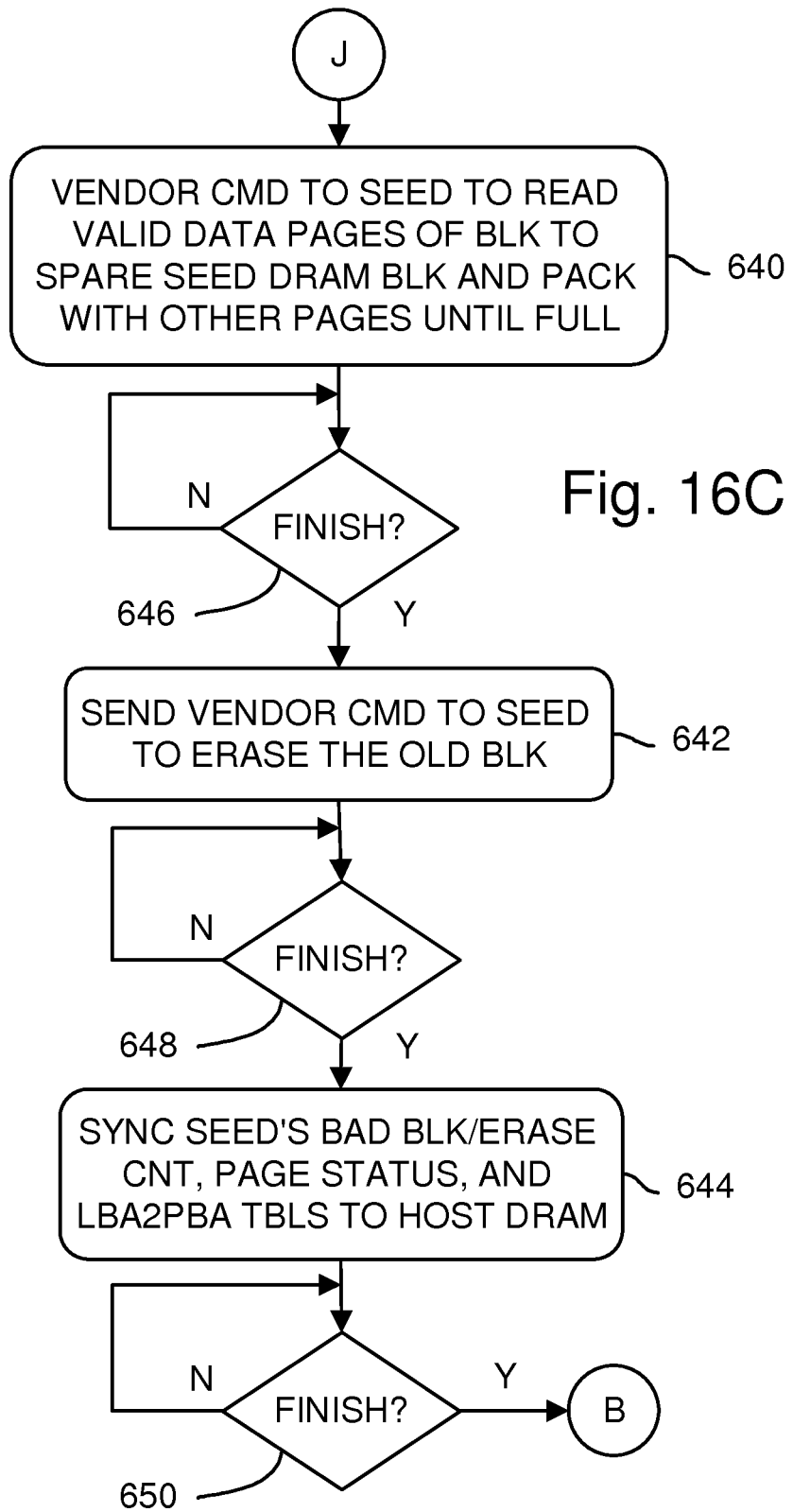
Figure 16D:
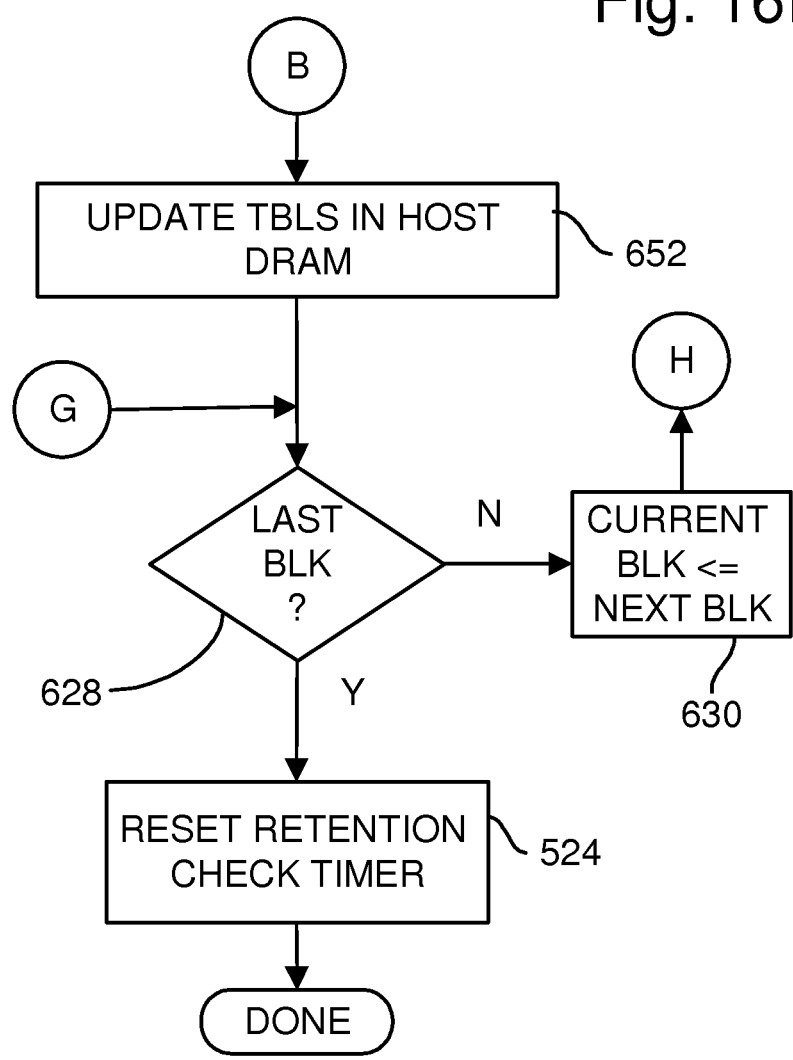

When the number of days since the last retention operation exceeds a retention-check threshold, step 518, or when the retention-check timer is triggered, step 699, the process continues in FIG. 16B. The current date is obtained, such as by reading from the host, and the retention threshold is obtained. The retention threshold may be a stored or fixed value, or it may be calculated from the flash type (single, double, or triple bits per cell, etc.) and the average erase count for blocks, step 602.

The current block is set to the first block, step 604, and the bad block/erase count table, and any page status tables are read from the host DRAM buffer, step 607. If the block is not a bad block, step 608, then the block write date for the current block is read from the bad block erase count table, step 610. The number of days since the last write of this block is calculated, such as by subtracting the block write date from the current date, step 612. When the number of days since the last write does not exceed the retention threshold time, step 614, or when the block is a bad block, step 608, then in FIG. 16D, if the block is not the last block, step 628, the next block is selected as the current block, step 630, and the process repeats from step 608. FIG. 16B.

When the number of days since the last write exceeds the retention threshold time, step 614, then (FIG. 16C) the host sends a vendor command to the SEED to read all valid pages from the current block to a spare block in the SEED's DRAM buffer, step 640. The spare block may be packed with pages from other blocks. Once full, the SEED reports a finished status back to the host, step 646.

The host sends a vendor command to the SEED to erase the old block, step 642, and when the erase is finished the SEED sends a finished status back to the host, step 648. Alternately, steps 642 and 648 can be skipped by putting the old block into a garbage collection list. The host sends a vendor command to the SEED to read or sync the table data for the bad block/erase count, page status, and LBA-to-PBA mapping tables, step 644. Once this table data has been synced to the host DRAM, the SEED sends a finished status back to the host, step 650. The host writes these updates to its DRAM tables, step 652. The next block can be processed.

When the current block is the last block, step 628, then host can reset its retention check timer, step 524, and wait for the next scheduled retention operation.

FIGS. 17A-D is a host process for refreshing non-SEED SSD's. Standard SSD's do not provide high-level commands that a SEED does. A SSD typically does not provide the host information about physical block addresses, only LBA's. Thus the host does not know the actual physical block. The LBA-to-PBA mapping table, bad block/erase count table, and page tables are hidden from the host by the SSD. The write date of each physical block is not know to the host.

The host maintains a file system. The host has created and accessed dates for files in the file system. The host can use this metadata to find older files that are in need of refreshing. However, the host can only refresh files based on logical addresses such as LBA's sent to the SSD.

Unfortunately, each file may be divided into pages that are stored in different physical blocks by the SSD. When a PBA stores pages from several different files, then that PBA may be refreshed multiple times, once for each file having a page in that PBA. Write amplification may occur, where the additional flash writes slows the SSD.

Figure 17A:
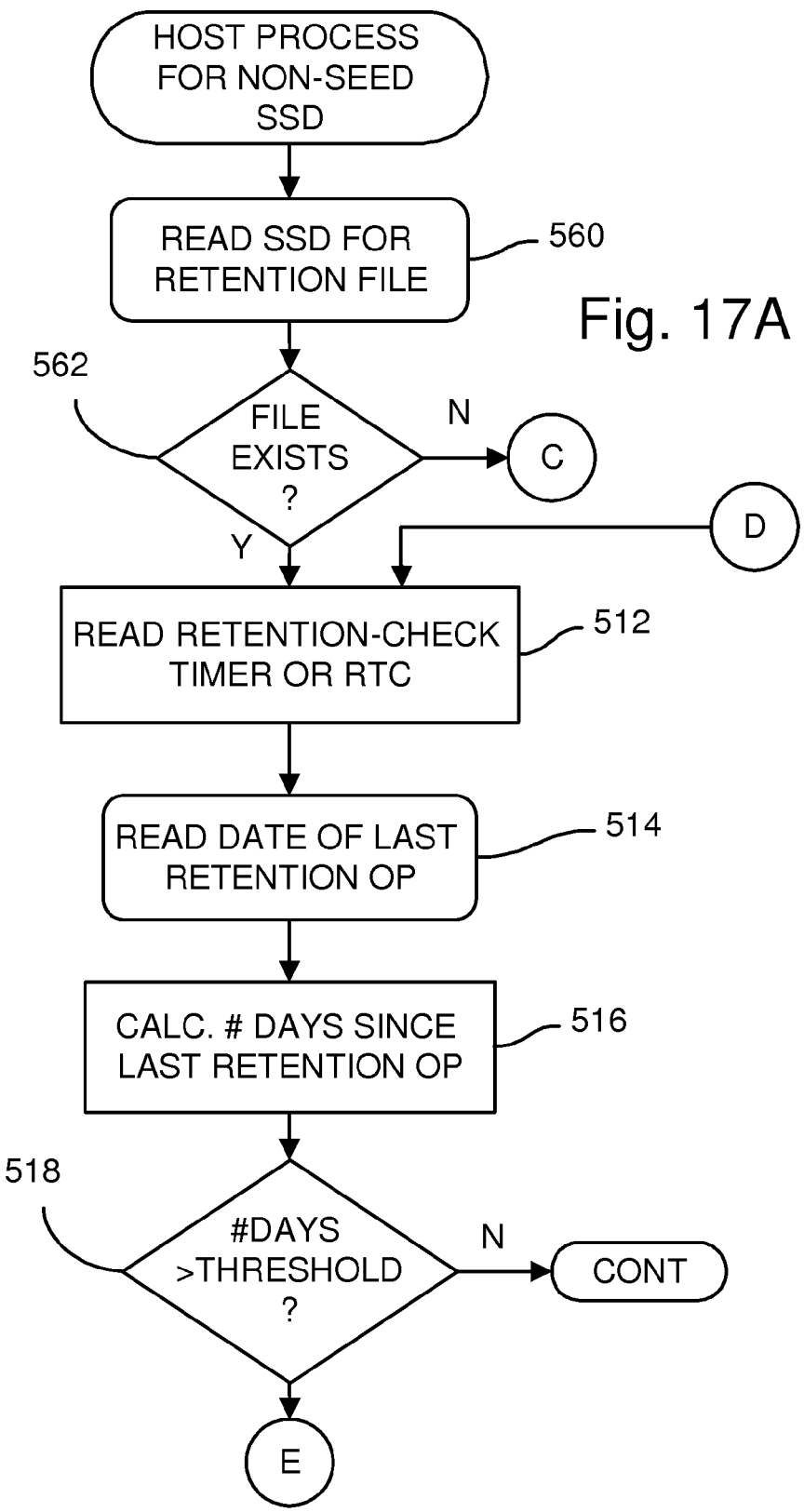
FIGS. 17A-D is a host process for refreshing non-SEED SSD's.
Figure 17B:
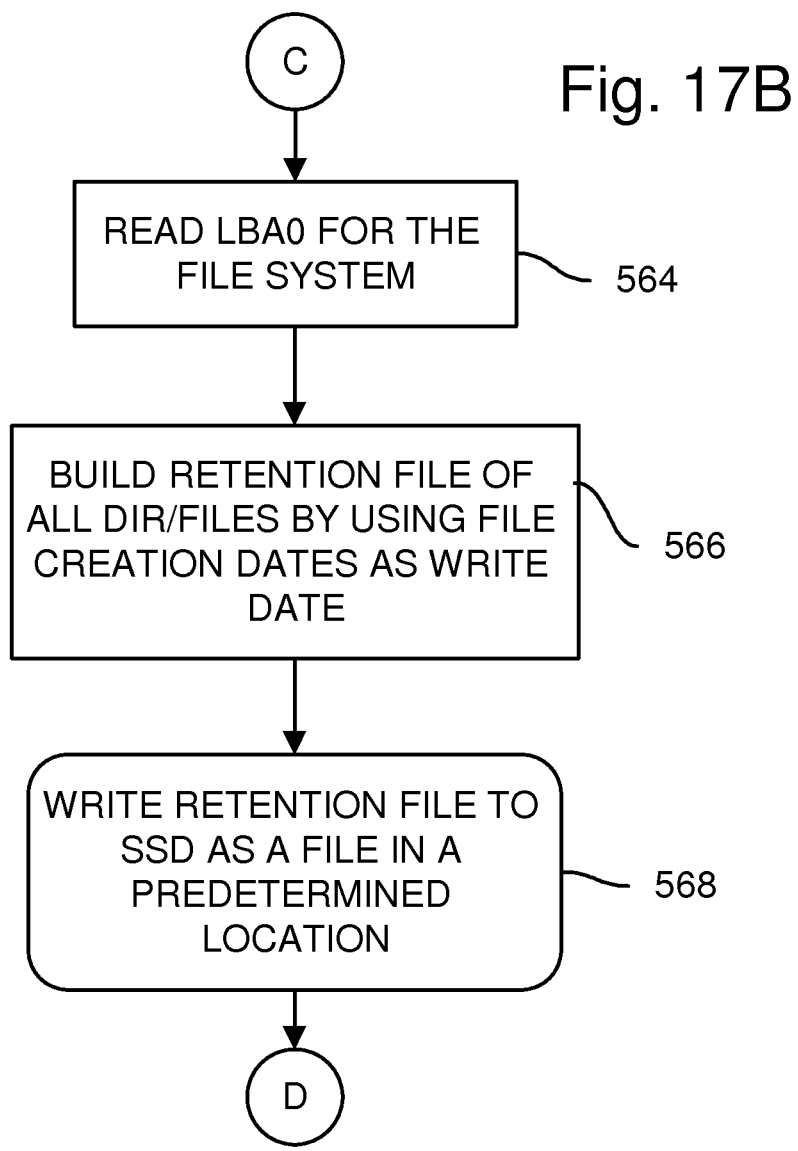

Nevertheless, the GNSD driver in the host may still manage retention operations by the SSD using LBA's. In FIG. 17A, the host has detected a non-SEED SSD attached, such as in step 506 of FIG. 10. The host process reads the SSD for a retention file, step 560. If the retention file does not yet exist, step 562, then the retention file is created as shown in FIG. 17B. The first block, LBA0, is read from the file system, step 564. The metadata for all files in the file system are parsed. The retention file is built by using the file creation date of each file as its write date, step 566. Once all files in the file system have been analyzed and an entry for each file created in the retention file, the retention file is stored in the SSD at a predetermined location, step 568.

Once the retention file has been created, the process resumes in FIG. 17A. The host routine starts with a setup and reset of a retention-check timer or a Real-Time-Clock (RTC), step 512. The host reads the date of the last retention operation by that SSD, step 514. The date of the last retention operation may be stored in the retention file, or may be stored elsewhere. The host calculates the number of days since the last retention operation by that SSD, step 516, such as by obtaining the difference between the host 300 current date and the last retention operation date. When the number of days since the last retention operation is less than a retention-check threshold, step 518, then it is too soon to perform a retention operation, and the process ends and waits for the next scheduled retention operation.

Figure 17C:
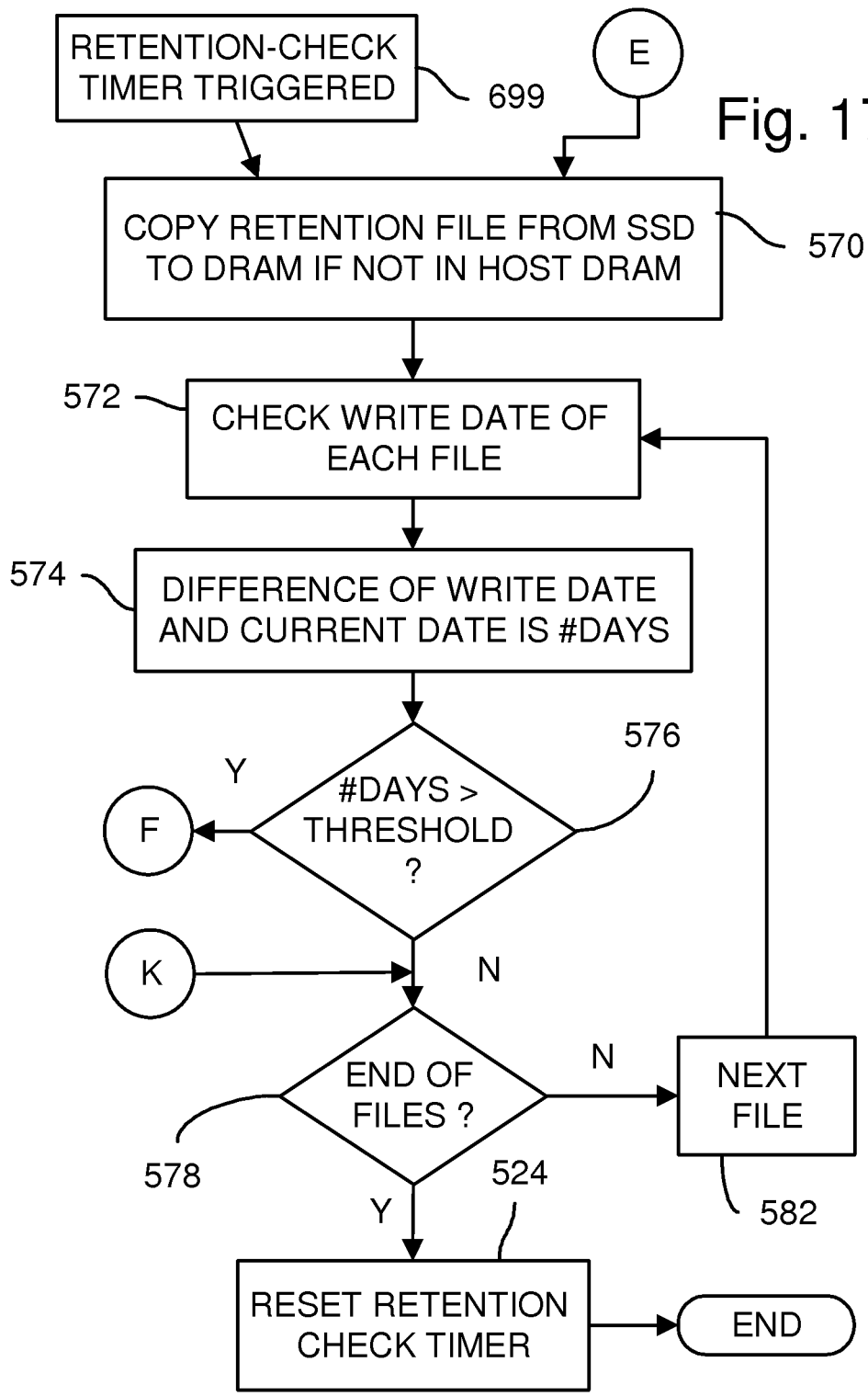

When the number of days since the last retention operation exceeds a retention-check threshold, step 518, or when the retention-check timer is triggered, step 699, the process continues in FIG. 17C. The retention file is read from the SSD and stored in the host's DRAM, step 570, if not already stored in host DRAM. The write date of each file is read from the retention file and checked, step 572. The difference between the file's write date and the current date is calculated as the number of days since the file was last refreshed, step 574.

When the number of days since the last write does not exceed the retention threshold time, step 576, then if the file is not the last file in the retention file, step 578, the next file is selected as the current file, step 582, and the process repeats from step 572. When the last file is reached, step 578, then the retention check timer is reset, step 524, and the host process ends.

Figure 17D:
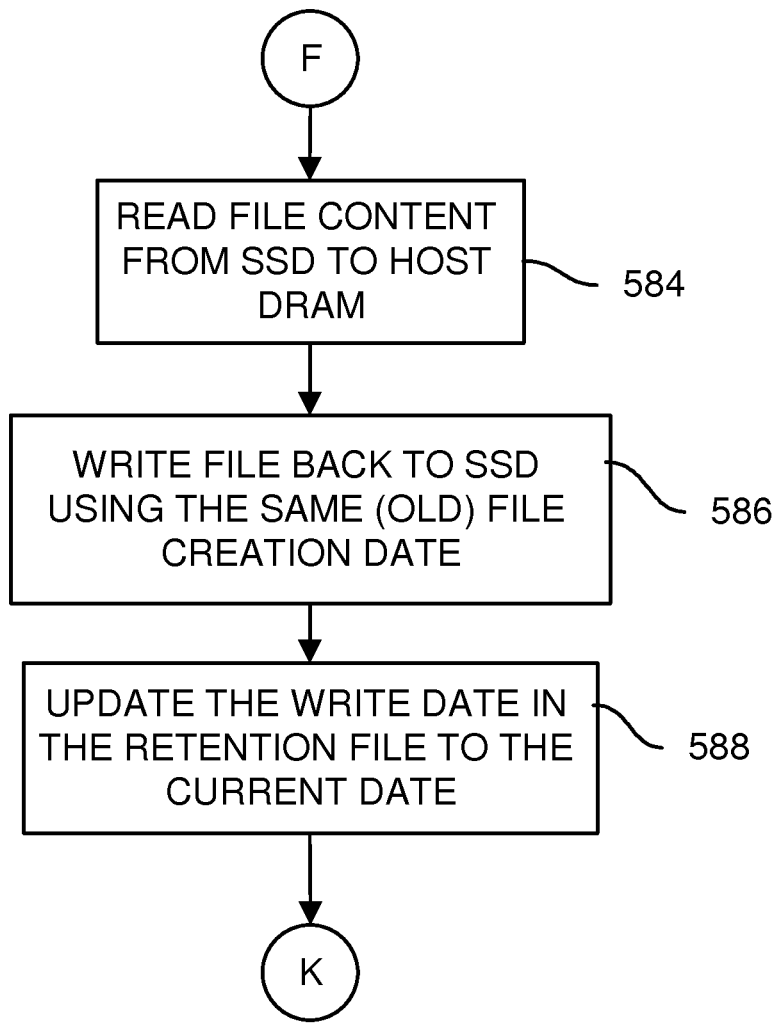

When the number of days since the last write exceeds the retention threshold time, step 576, then in FIG. 17D the host reads the file contents from the SSD, step 584. The host writes the file contents back to the SSD, but using the old file's creation date as the creation date of the new file being written back to the SSD, step 586. This forces the SSD to effectively refresh the file contents by writing the contents to a new block in flash memory. The entry for the file in the retention file is updated by writing the current date as the write date, step 588. Thus the file creation date is retained by the file system metadata, but the refresh date is stored in the retention file as the write date.

Figure 18:
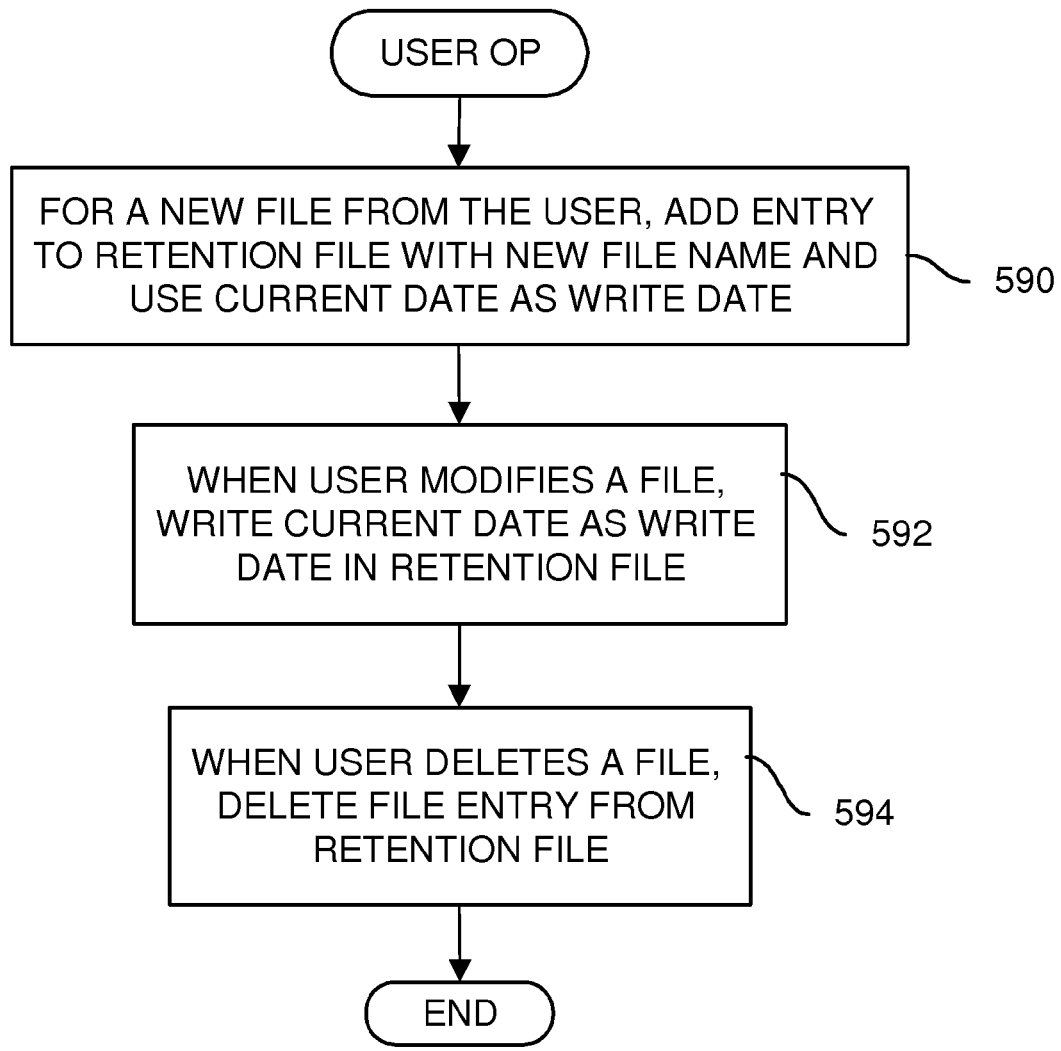
FIG. 18 shows the host handling a user access operation of a file and updating the file's access time.

FIG. 18 shows the host handling a user access operation of a file. When the user access a file that has its write data tracked by the host using the retention file, as described in FIG. 17, the host executes this user op routine.

When the user creates or adds a new file to the file system, step 590, then a new entry is created for the file in the retention file. The new entry has the file name and the write date set to the current date.

When the user modifies a file in the file system, step 592, then the file's entry is found in the retention file. The write date for the file's entry is set to the current date. When a user deletes a file, that file's entry is deleted from the retention file, step 594.

As an alternative to FIG. 17, FIGS. 19A-C is a whole-device host process for refreshing non-SEED SSD's. In FIG. 17, the host tracked the write date for each file. In this embodiment of FIG. 19, all files are refreshed at the same time. The host does not track write dates of individual files. Only one write date is stored for all files. Thus the size of the retention file is significantly reduced, and operational complexity is reduced.

Figure 19A:
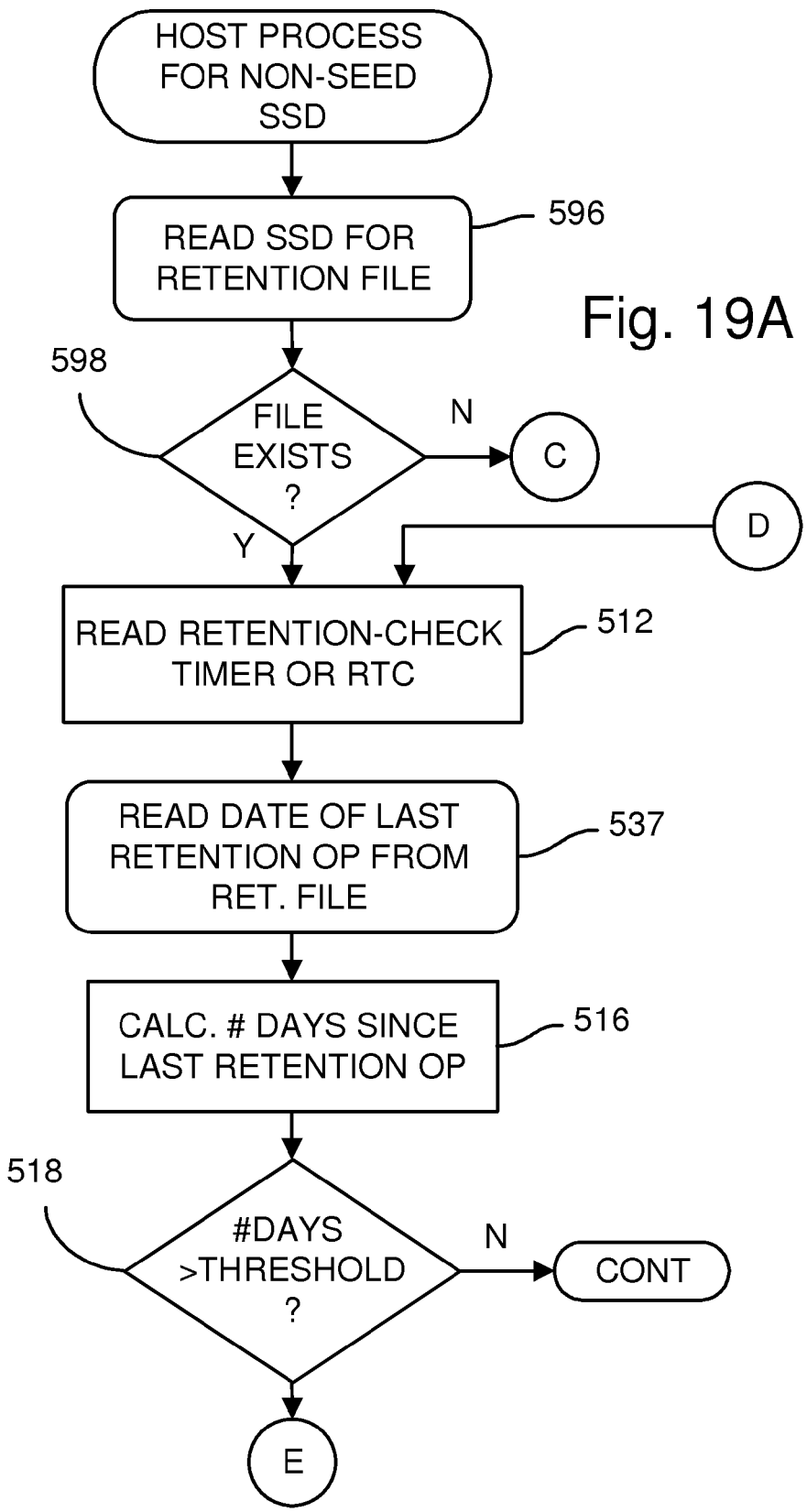

In FIG. 19A, the host has detected a non-SEED SSD attached, such as in step 506 of FIG. 10. The host process reads the SSD for a retention file, step 596. If the retention file does not yet exist, step 598, then the retention file is created as shown in FIG. 19B. The first block, LBA0, is read from the file system, step 564. The metadata for all files in the file system are parsed. The file creation date of each file is checked, step 660, and the earliest of the file creation dates is stored as the date of the last retention operation. The retention file is created with a single entry having this earliest file creation date as the write date, or the date of the last retention operation. The retention file is stored in the SSD at a predetermined location, step 662.

Once the retention file has been created, the process resumes in FIG. 19A. The host routine starts with a setup and reset of the retention-check timer or RTC, step 512, and the date of the last retention operation by that SSD, step 537. The date of the last retention operation is stored in the retention file. The host calculates the number of days since the last retention operation by that SSD, step 516, such as by obtaining the difference between the host 300 current date and the last retention operation date. When the number of days since the last retention operation is less than a retention-check threshold, step 518, then it is too soon to perform a retention operation, and the process ends.

Figure 19C:
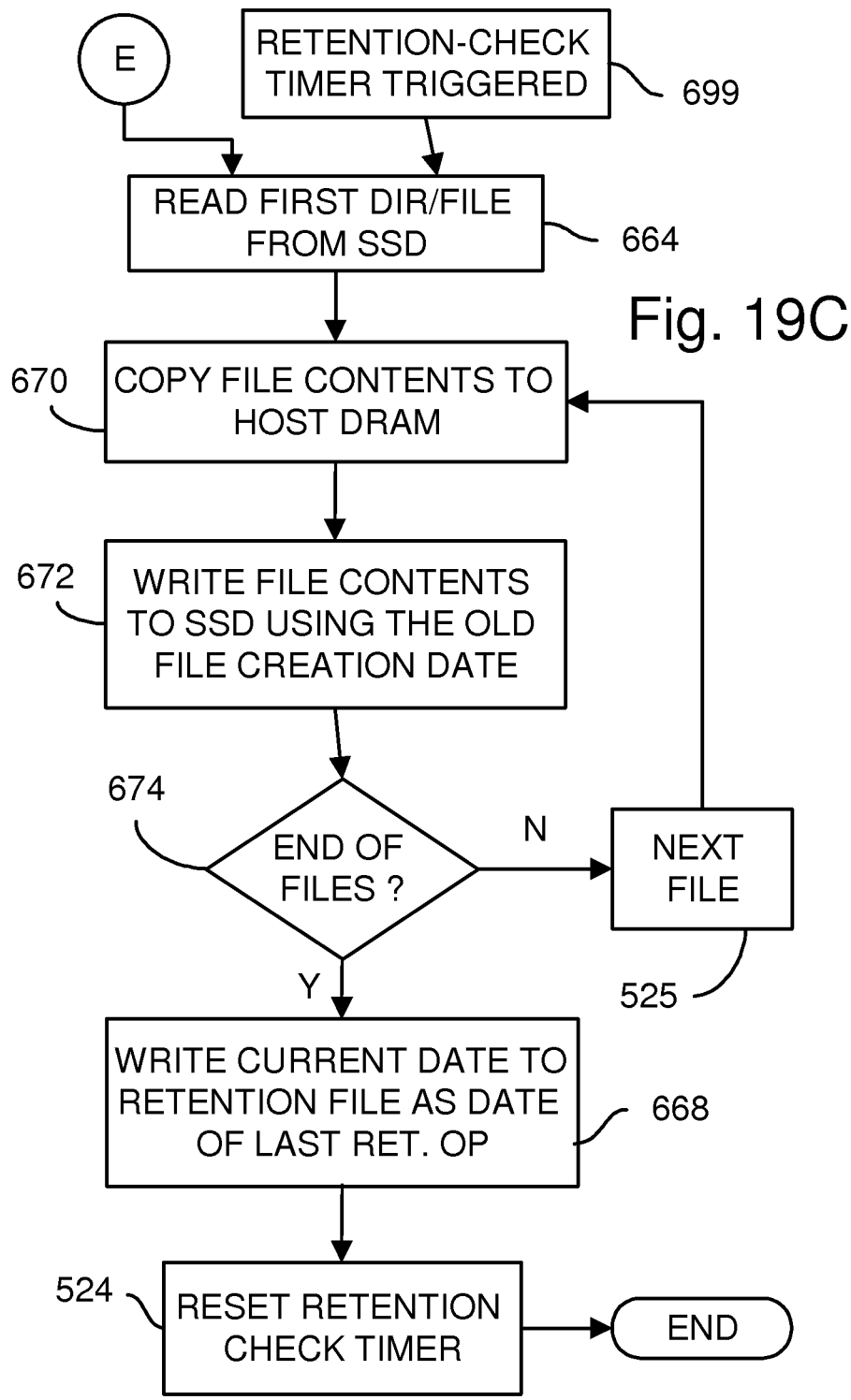

When the number of days since the last retention operation exceeds a retention-check threshold, step 518, or when the retention-check timer is triggered, step 699, the process continues in FIG. 19C. The host reads the first file or directory from the SSD, step 664. The host reads the file contents from the SSD and stores the file contents in host DRAM, step 670. The host writes the file contents back to the SSD, but using the old file's creation date as the creation date of the new file being written back to the SSD, step 672. This forces the SSD to effectively refresh the file contents by writing the contents to a new block in flash memory. Thus the file creation date is retained by the file system metadata. When more files are present, step 674, the process repeats with the next file, step 525.

When the last file is reached, step 674, then the current date is written to the retention file as the write date, or the date of the last retention operation, step 668. The retention check timer is reset, step 524, and the host process ends and waits for the next scheduled retention operation.

Figure 20A:
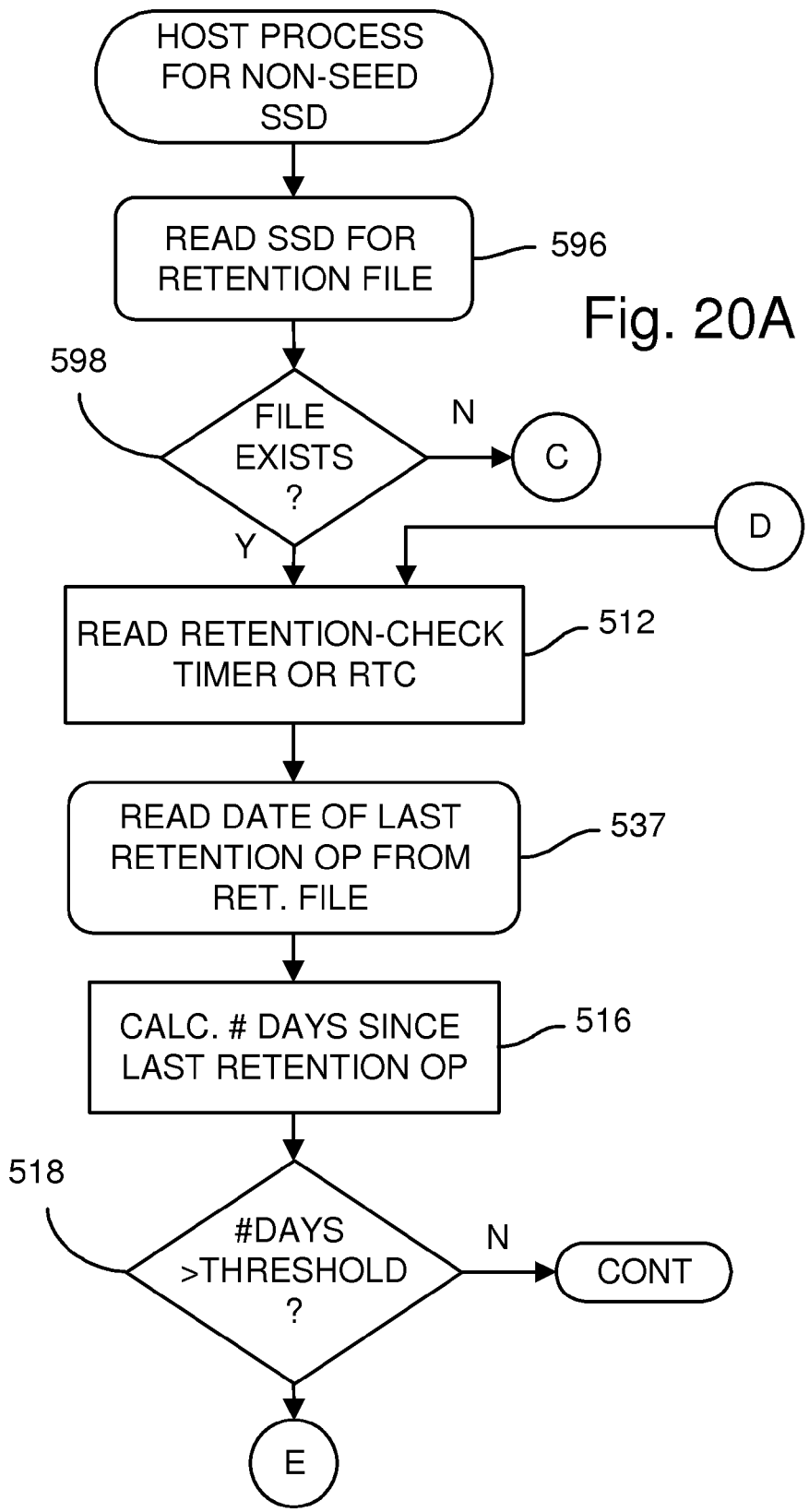
Figure 20C:
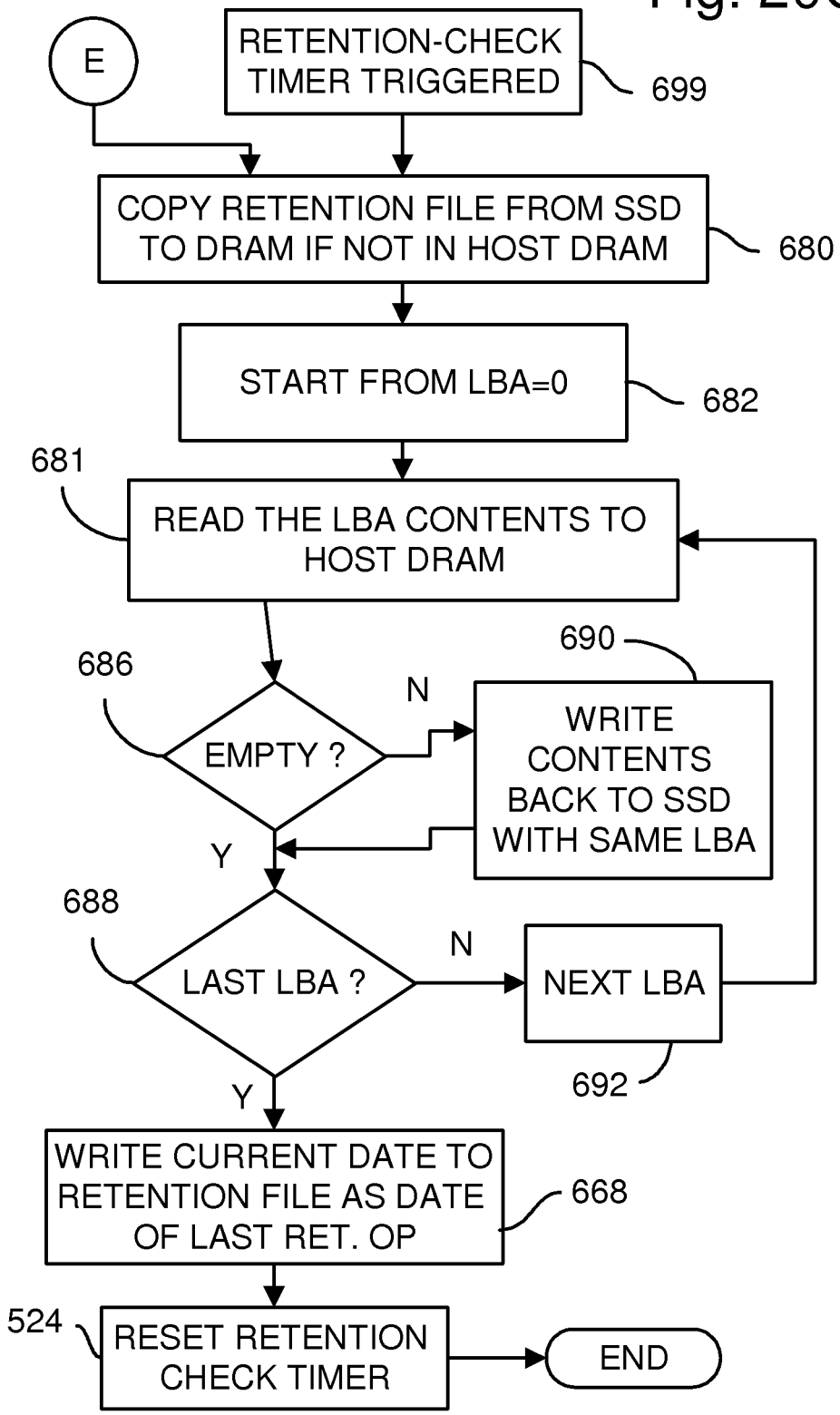

FIGS. 20A-C is a LBA-based host process for refreshing non-SEED SSD's. In FIG. 17, the host tracked the write date for each file. In FIG. 19, the host refreshed all files at the same time and did not track write dates of individual files. In this embodiment of FIG. 20, all logical blocks are refreshed at the same time. The host performs a refresh by writing logical blocks rather than by writing files. This may reduce write amplification when one LBA contains several different files.

In FIG. 20A, as another alternative to FIG. 17, the host has detected a non-SEED SSD attached, such as in step 506 of FIG. 10. The host process reads the SSD for a retention file, step 596. If the retention file does not yet exist, step 598, then the retention file is created as shown in FIG. 20B. The first block, LBA0, is read from the file system, step 564. The metadata for all files in the file system are parsed. The retention file is built by using the file creation date of each file as its write date, step 660. Once all files in the file system have been analyzed and an entry for each file created in the retention file, the retention file is stored in the SSD at a predetermined location, step 662.

Once the retention file has been created, the process resumes in FIG. 20A. The host routine starts with a setup and reset of the retention-check timer or RTC, step 512, and the date of the last retention operation by that SSD, step 537. The date of the last retention operation is stored in the retention file. The host calculates the number of days since the last retention operation by that SSD, step 516, such as by obtaining the difference between the RTC current date and the last retention operation date. When the number of days since the last retention operation is less than a retention threshold, step 518, then it is too soon to perform a retention operation, and the process ends.

When the number of days since the last retention operation exceeds a retention-check threshold, step 518, or when the retention-check timer is triggered, step 699, the process continues in FIG. 20C. The retention file is read from the SSD and stored in the host's DRAM, step 680, if not already stored in host DRAM. The first logical block, LBA0, is selected, step 682.

The host reads the LBA contents from the SSD, and stores the LBA contents in host DRAM, step 681. If the LBA contents are not empty, step 686, the host writes the LBA contents back to the SSD using the same LBA address, step 690. This forces the SSD to effectively refresh the LBA contents by writing the contents to a new block in flash memory. If the LBA contents are empty, step 686, then write-back is skipped.

When the LBA is not the last LBA, step 688, the next LBA is selected as the current LBA, step 692, and the process repeats from step 681.

When the last LBA is reached, step 688, then the current date is written to the retention file as the write date, step 668. The retention check timer is reset, step 524, and the host process ends and waits for the next scheduled retention operation.

Figure 21A:
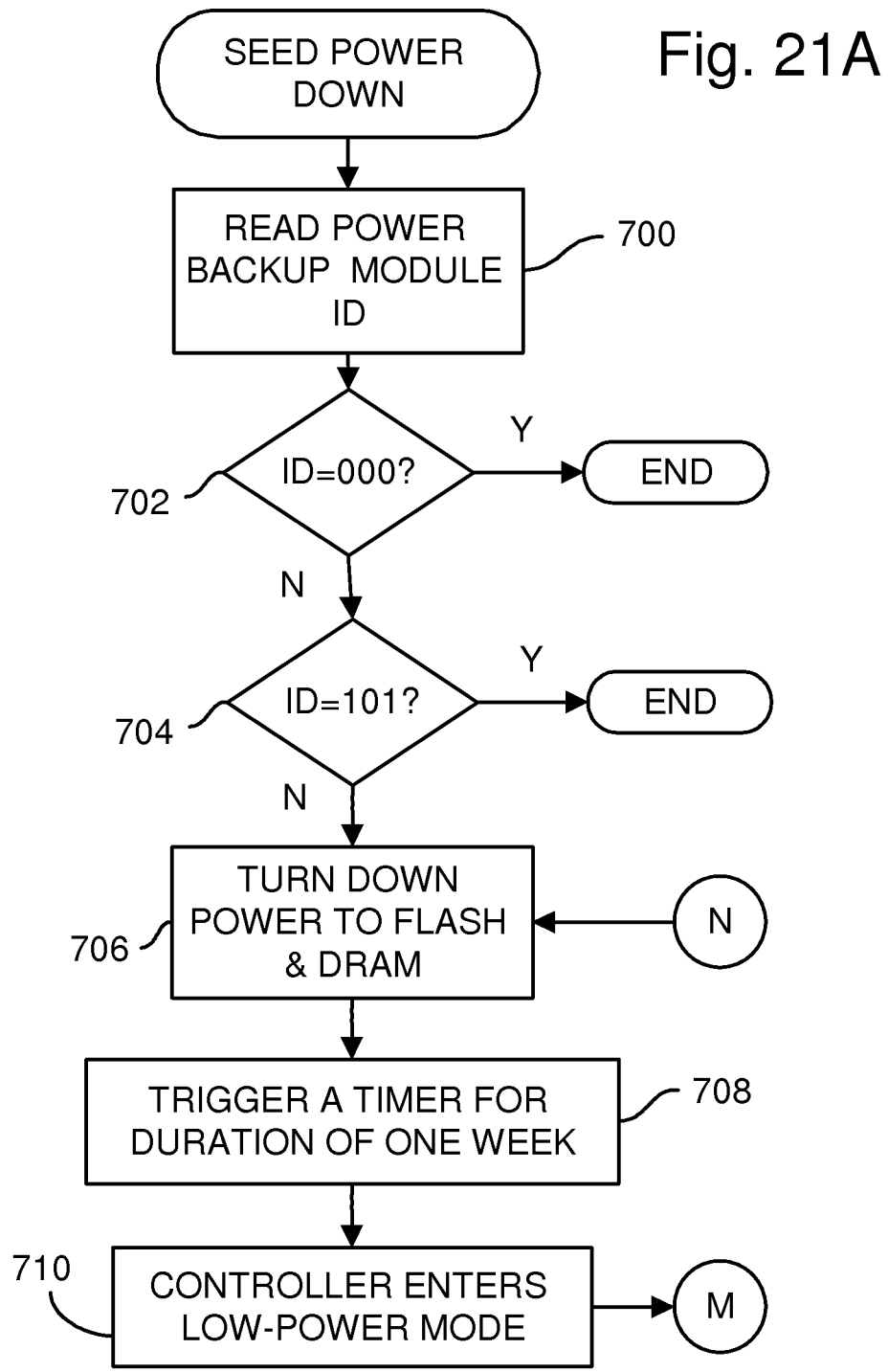
FIGS. 21A-B show a power-down routine for the SEED equipped with a battery.
Figure 21B:
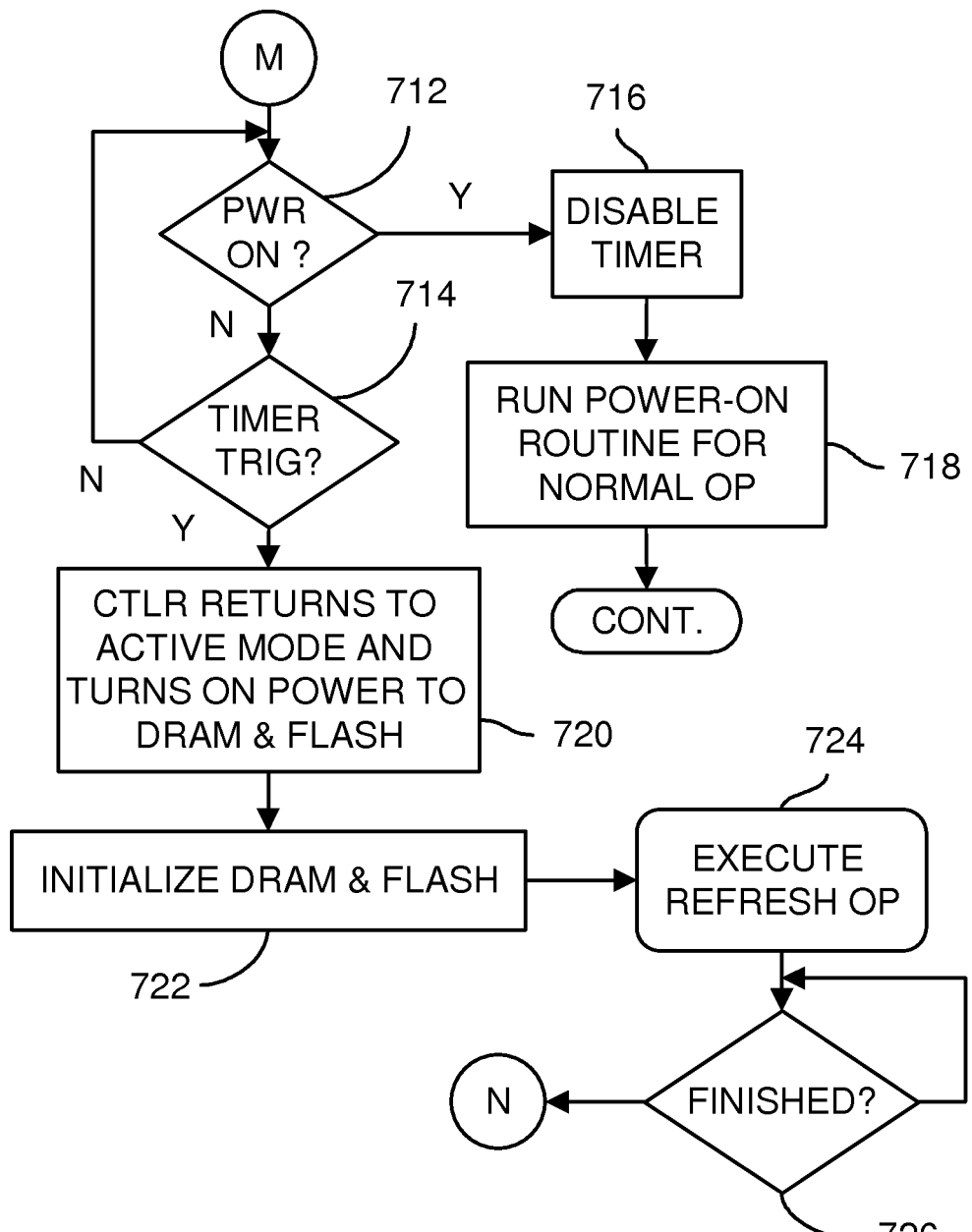

FIGS. 21A-B show a power-down routine for the SEED. At times, the SEED may be disconnected from the host, or the host may be powered-down or in standby mode. The SEED may have its own battery power, either directly or provided through a power card. The retention time could be violated if the host remains off or disconnected for a long period of time. The SEED power down routine periodically performs a retention operation to ensure data retention, even when host power is not available or the host GNSD driver is not running.

In FIG. 21A, when the SEED is powered down, the power backup module identifier is read, step 700. When the module ID is 000, step 702, or 101, step 704, there is either no battery power for the SEED, or only a super-capacitor is available that does not have sufficient energy to power a retention routine. Otherwise, the power-down routine can continue because sufficient energy from a backup battery is available to power the SEED.

Power is turned down to the flash and DRAM, step 706. Flash and DRAM may be completely powered off, or merely placed in a lower-power standby mode. A timer is set for one week, for example, step 708, and the SEED controller enters a low-power mode such as standby, step 710.

In FIG. 21B, if power is turned back on, step 712, the timer is disabled, step 716, and the power-on routine for normal operation is executed, step 718, to revive the SEED.

When power is not turned on, step 712, and the timer has not yet timed out, step 714, the SEED continues to wait in the low-power mode. Once the timer triggers after the one-week period has elapsed, step 714, the SEED controller returns to active mode and powers up the flash and DRAM, step 720. The SEED initializes the flash and DRAM, step 722.

The SEED executes the retention routine, step 724, so that the flash is refreshed. The retention routine may be that of FIG. 13, where the SEED checks the write date for each block in flash memory, or another routine. Once the retention routine is finished, step 726, then the SEED can power down, step 706, and reset the retention-check timer to one week, step 708, repeating the process. The RTC could also be used rather than a retention-check timer.

Figure 22:
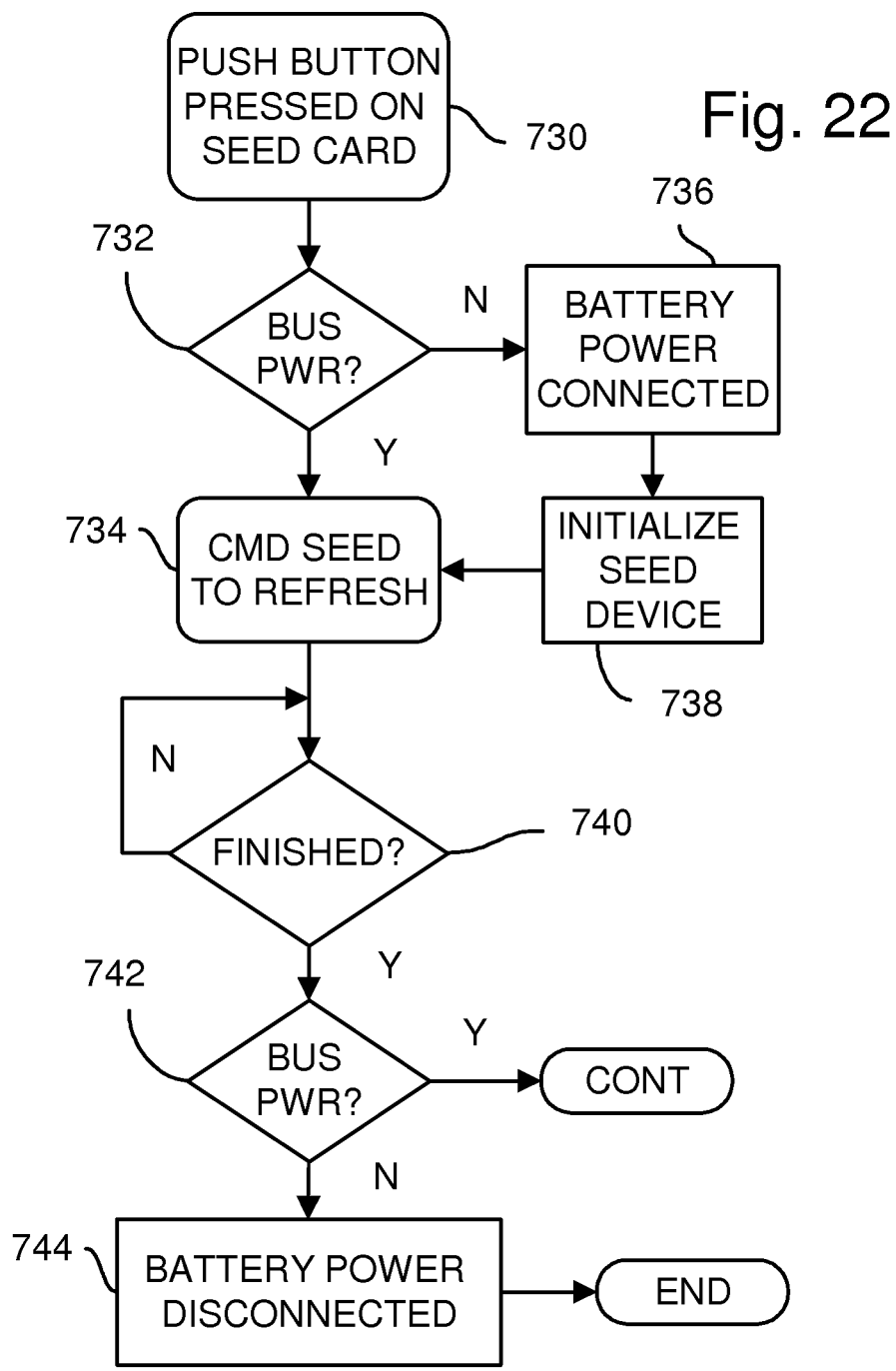
FIG. 22 is a push-button refresh routine for a SEED.

FIG. 22 is a push-button refresh routine for a SEED. When a user presses push button 474 on SEED 200, FIG. 8, step 730, the SEED performs a refresh. When power is available on the bus, such as from the host or from the SEED card through the USB port, step 732, the SEED firmware executes the refresh routine, step 734, as shown in FIG. 13.

When bus power is not available, step 732, and a battery is available, the battery power is switched to drive the SEED, step 736, and the SEED is initialized, step 738, before the SEED performs a refresh operation, step 732. If no bus or battery power is available, then refresh cannot be performed and the routine cannot execute.

Once the SEED has finished the retention operation, step 740, if bus power is not available, step 742, the battery is disconnected from the SEED, step 744, perhaps after a power-down routine is executed. Otherwise the SEED may remain running, or may enter a low-power mode after a period of time.

ALTERNATE EMBODIMENTS

Several other embodiments, combinations and modifications of the embodiments are contemplated by the inventors.

While moving a full page or block to the SEED, SSD, or to flash has been described, a nearly full page could also be moved before being completely full. Thus full may refer to being within some threshold of full, such as the page size minus 512 bytes.

Many encodings of the data-type bits and other status fields, pointers, etc. are possible. The data-type status bits do not need to be the first bits in an entry. Entries could be linked to entries in other tables, such as having a separate table for tags or valid bits. Temporary files could have a variety of extensions, and new extensions could be added to the list to search for. Temporary files created by well-known programs such as word processors and internet browsers have well-known files extensions, but additional extensions may be added at any time. These additional file extensions could be added through firmware updates to the control software for SEED and SSD controllers, or by software updated to GNSD application 180 and GNSD driver 100.

The size of DRAM buffer used by each part of Endurance Translation Layer (ETL) may be fixed by the firmware of the SSD controller. The each part of ETL also can be dynamically adjusted by the controller firmware automatically or manually based on the usage or preference of the user. Due to the limited size of DRAM buffers, not all ETL functions may be accommodated in it at the same time. The various ETL functions may be adaptive to the real working environment. The controller may adjust the size used by each ETL to optimize the DRAM buffer. The adaptive adjustment can be done periodically based on the usage patterns of the device.

For a TLC flash device, the DRAM buffer can be substituted with NVRAM such as phase-change memory (PCM), ferroelectric random-access memory (FRAM), Magnetoresistive RAM (MRAM), Memristor, PRAM, Resistive RAM (RRAM), Racetrack memory, and nano RAM (NRAM) etc. The advantage of NVRAM is that all the ETL supported tables etc. may remain in NVRAM (no need to put in the flash memory) and other flash memory destined data (such as data write cache etc.) is retained even with power off, so the backup power circuit is no longer needed even when power is turned off suddenly. A tmp etc. & mapping table, and read cache & mapping tables can be optionally discarded at the power down or at the next power up initialization. Other than MLC, the disadvantage of NVRAM is the cost. For MLC, the disadvantage is slow speed and limitations on write/erase times. The MLC can be derived from TLC by allocating part of TLC that only has strong pages programmed. Some of the ETL functions may be implemented in an SRAM in SEED 200.

In the TLC flash device, the DRAM buffer also can be substituted with combinations such as DRAM+SRAM, DRAM+MLC, DRAM+PCRAM or DRAM+MRAM. When combinations of DRAM buffering is used such as DRAM+MLC, the ETL supported functions are managed in DRAM but some of them are stored in MLC. Some of the data in the DRAM buffer can be discarded eventually such as temp. data and mapping tables, and read cache and mapping tables, that are not moved to MLC when power is off. Tables and data that need to be kept when power is off such as the block erase count table, the page Status table, S.M.A.R.T. data collector, etc. need to be stored to MLC when power is turned off suddenly. Copying to MLC is faster compared to TLC flash memory. In case of server applications, temp. data and mapping tables, and read cache and mapping tables cannot be discarded; those areas will be stored to MLC using power backup when power is turned off suddenly. Another way is to insure the data of interest in ETL of the DRAM is copied to the MLC. In case of a power off, a valid copy of data in ETL can be kept at MLC. At power up, the data in ETL can be loaded back to DRAM from MLC. The copying method can be modified by recording the minor differences, which will reduce the amount of copying data and therefore reduce the writes to MLC.

DRAM and MLC or DRAM and SLC do not necessary use different types of flash memory 196 such as SLC, MLC, TLC, QLC, PLC, 3D NAND etc. Instead, the MLC can be derived from the TLC by allocating a part of the TLC that only has strong pages programmed. The SLC can be derived from MLC, TLC, QLC, PLC, etc. by allocating part of the MLC, TLC, QLC, PLC, etc. that only has strong pages programmed. For example, an Enhanced TLC Flash can be realized by a portion of TLC configured as SLC (with strong pages) using such as one quarter of the TLC used as SLC (strong page) and the reminder of TLC as TLC (weak page). Or a portion of TLC configured as MLC (strong page) and the reminder of TLC as TLC (weak page). Additionally, program/erase manager 41 (FIG. 14) may slow down page writing and block erasing time to help prolong the life of the oxide layer of cells of the flash. The slower page write/block erase time can be applied to the Enhanced TLC Flash to increase the endurance at the expense of decreased retention time.

By using refresh manager 202, the retention time can be increased. Due to the Enhanced TLC Flash including SLC (strong page) and TLC (weak page) and with differing retention times, refresh manager 202 can track the usage of blocks as SLC (strong page) or TLC (weak page) and then adjust the refresh or retention time accordingly. Alternatively, an enhanced TLC Flash can be realized by a portion of TLC configured as SLC (strong page) usage such as one quarter of TLC used as SLC (strong page). Similarly, MLC can be used as combination of SLC (strong page)/MLC (weak page) and QLC can be used as combinations such as SLC (strong page)/QLC (weak page), MLC (strong page)/QLC (strong page), TLC (strong page)/QLC (strong page), or any combination of SLC/MLC/TLC/QLC. Alternatively, MLC can be used as SLC (strong page), etc. The above functions also can be implemented in SEED 200.

The retention technologies described herein attempt to solve the retention issues of NAND flash memory. There are several non-volatile memories, such as MRAM, PCM, RRAM, Memristors, NRAM, etc. which are using competing technologies to replace NAND flash memory.

The super-endurance flash drive can be combined with a Hard Disk Drive (HDD), with a super-endurance flash drive as the cache and HDD as storage. The super-endurance flash drive is of high endurance and is a better fit as a cache. The overall performance may improve for this hybrid device. Another way to insure the data of interest in ETL of DRAM is copying to the HDD. In case of power off, a valid copy of data in ETL can be kept in HDD. At power up, those data in ETL can be loaded back to DRAM from HDD. The copying method can be modified by recording the minor differences which will reduce the amount of copying data and therefore reduce the writes to HDD.

The boot image of the OS can be preloaded to the DRAM buffer to speed up the host boot up. Once the boot up process ends, the DRAM buffer is released for later normal operation.

The dirty DRAM buffer must be written to flash memory when the host is in sleep or stand-by mode. The dirty DRAM buffer can be written to flash memory when the user of the host is logged out.

The grouping of write data is not limited to a page as a unit. Grouping data can be in a larger unit such as multiple-pages (meta-pages) and whole blocks, etc.

While categorization of the data-type of a host access has been described as comparing the logical address from the host to one or more address ranges, this compare may compared only a portion of the logical address to ranges that represent the address ranges. Data types could also be identified by parsing the host write data for certain formats, such as a FAT format or a FDB format. Earlier host writes in a sequence could also be checked for their data formats. The FAT file system has been used as an example. FDB/FAT are the meta data of the FAT file system. Other file systems such as LINUX, Apple OS, and Android etc., have their own meta data with different names but are equivalents.

Each block may be divided into multi-page zones. For example, a block may have 16 pages and 4 zones, with 4 pages per zone. Some of the mapping may be for zones rather than for individual pages or blocks in this alternative embodiment. Alternatively, in a special case, there can be one page per zone. Fewer mapping entries are needed with zone-mode than for page-mode, since each zone is multiple pages.

The upper bits of the logical-sector address (LSA) from the host may select a cluster or district. All of the entries in a mapping table may be for the same district. When the district number from the LSA matches the district number of all the entries in the mapping table, the LBA from the LSA selects an entry in the mapping table. Hybrid or multi-level mapping tables may also be used. Since the LBA ranges for the FAT1/2 are known, the table contents data type bits "100" can be omitted. The Mapping table can have a granularity of block or page.

Copying of blocks for relocation is less frequent with page mapping since the sequential-writing rules of the non-SLC flash are violated less often in page mode than in block mode. This increases the endurance of the flash system and increases performance.

The mapping tables may be located in an extended address space, and may use virtual addresses or illegal addresses that are greater than the largest address in a user address space. Pages may remain in the host's page order or may be remapped to any page location. In another embodiment such as for data center applications, the paging and temporary files can be treated as normal user data to simplify the controller operation but with the expense of flash endurance. The endurance spare/swap area can provide extended over-provisioning by using a DRAM buffer as endurance spare/swap buffer instead of using flash memory. The compression function can be optionally turned off in situations when the host is already providing a compression function. In other embodiments, the controller can treat the paging file as user data file to simplify the controller function.

Many variations of the block diagrams are possible. A ROM such as an EEPROM could be connected to or part of a controller and be dedicated to storing firmware for a virtual storage processor. This firmware could also be stored in the main flash modules. The Host interface bus can be a Serial AT-Attachment (SATA) bus, a Peripheral Components Interconnect Express (PCIe) bus, a compact flash (CF) bus, or a Universal-Serial-Bus (USB), NVMe, a Firewire 1394 bus, a Fibre Channel (FC) bus, Thunderbolt, etc. Internal buses may use standards such as for a Serial AT-Attachment (SATA) bus, an integrated device electronics (IDE) bus, a Peripheral Components Interconnect Express (PCIe) bus, a compact flash (CF) bus, a Universal-Serial-Bus (USB), a Secure Digital (SD) bus, a Multi-Media Card (MMC) bus, a Firewire 1394 bus, a Fibre Channel (FC) bus, various Ethernet buses, etc.

The flash memory may be embedded on a motherboard or SSD board or could be on separate modules. Capacitors, buffers, resistors, and other components may be added. The controller may be integrated on the motherboard or on a separate board or module. Flash memory can be integrated with the controller or with raw-NAND flash memory chips as a single-chip device or a plug-in module or board.

Using multiple levels of controllers, such as in a president-governor arrangement of controllers, the controllers in the SEED may be less complex than would be required for a single level of control for wear-leveling, bad-block management, re-mapping, caching, power management, etc. Less expensive hardware may be used in the controller, such as using an 8051 processor for a controller or a virtual storage processor or a transaction manager, rather than a more powerful processor core such as a an Advanced RISC Machine ARM-9 CPU core. For a certain applications, a more powerful processor is considered.

Different numbers and arrangements of flash storage blocks can connect to the SEED. Rather than use a LBA storage bus interface or differential serial packet buses, other serial buses such as synchronous Double-Data-Rate (DDR), ONFI, Toggle NAND, a differential serial packet data bus, a legacy flash interface, etc.

Mode logic could sense the state of a pin only at power-on rather than sense the state of a dedicated pin. A certain combination or sequence of states of pins could be used to initiate a mode change, or an internal register such as a configuration register could set the mode. A multi-bus-protocol chip could have an additional personality pin to select which serial-bus interface to use, or could have programmable registers that set the mode to hub or switch mode.

A transaction manager, controllers, processes, and functions can be implemented in a variety of ways. Functions and processes can be programmed and executed by a CPU or other processor, or can be implemented in dedicated hardware, firmware, or in some combination. Many partitionings of the functions can be substituted. The SEED controller may be hardware, or may include firmware or software or combinations thereof.

Overall system reliability is greatly improved by employing Parity/ECC with multiple flash channels, and stripping data segments into a plurality of NVM blocks. For example, a ninth flash chip can be used with the flash memory interface. The Parity of the other eight flash chips is written to this ninth flash chip to provide extra protection of data in case one of the eight flash chips encounters a fatal read error. However, it may require the usage of a CPU engine with a DDR/SDRAM cache in order to meet the computing power requirement of the complex ECC/Parity calculation and generation. Another benefit is that, even if one flash block or flash module is damaged, data may be recoverable, or the SEED can initiate a "Fault Recovery" or "Auto-Rebuild" process to insert a new flash module, and to recover or to rebuild the "Lost" or "Damaged" data. The overall system fault tolerance is significantly improved.

The flash cell's floating gate is programmed by injection of electrons into it. The flash memory controls the injection of electrons at page write so that it stays within two reference voltage levels. The NAND flash structure's bit-lines are connected to a string of 32 cells and each cell is also connected to 32 different word-lines. After a cell is written with data, any write and read to the adjacent cells will cause interference to the cell. The interference will either inject or remove electrons from the floating gate of the cell. A long period of time will also affect the number of electrons in the floating gate of the cell. Due to the changing of the quantity of electrons in the floating gate, the output voltage level will shift accordingly when read. If the output voltage level shifts across the reference voltage boundary, the read result will be wrong.

Wider or narrower data buses and flash-memory chips could be substituted, such as with 16 or 32-bit data channels. Alternate bus architectures with nested or segmented buses could be used internal or external to the SEED. Two or more internal buses can be used in the SEED to increase throughput. More complex switch fabrics can be substituted for the internal or external bus.

Data striping can be done in a variety of ways, as can parity and error-correction code (ECC). Packet re-ordering can be adjusted depending on the data arrangement used to prevent re-ordering for overlapping memory locations. The SEED can be integrated with other components or can be a stand-alone chip.

Additional pipeline or temporary buffers and FIFO's could be added. Separate page buffers could be provided in each channel. A clock source could be added.

A single package, a single chip, or a multi-chip package may contain one or more of the plurality of channels of flash memory and/or the SEED or SSD.

A MLC-based flash device may have four MLC flash chips with two parallel data channels, but different combinations may be used to form other flash modules, for example, four, eight or more data channels, or eight, sixteen or more MLC chips. The flash devices and channels may be in chains, branches, or arrays. For example, a branch of 4 flash devices could connect as a chain to the SEED. Other size aggregation or partition schemes may be used for different access of the memory.

The host can be a desktop PC motherboard or other PC platform such as a server, a Notebook, a Netbook, a tablet, a smart phone, a mobile communication device, a personal digital assistant (PDA), a digital camera, a production tool or tester, a combination device, or other device. The host bus or host-device interface can be SATA, PCIE, Thunderbolt, SD, USB, NVMe, eMMC, iSSD, or other host bus, while the internal bus to a flash module can be PATA, multi-channel SSD using multiple SD/MMC, compact flash (CF), USB, or other interfaces in parallel. A flash module could be a standard PCB or may be a multi-chip modules packaged in a TSOP, BGA, LGA, COB, PIP, SIP, CSP, POP, or Multi-Chip-Package (MCP) packages and may include raw-NAND flash memory chips or raw-NAND flash memory chips may be in separate flash chips, or other kinds of NVM flash memory such as toggle, ONFI, eMMC, iSSD, 3D NAND. SEED SSD may use eMMC with a RAID and eMMC may use a SEED structure. The internal bus may be fully or partially shared or may be separate buses. The SSD system may use a circuit board with other components such as LED indicators, capacitors, resistors, etc. Power management may be added at one or more levels. The SEED SSD can work with or without a GNSD driver. A PCIe RAID DRAM cache card may incorporate a GNSD driver and multiple SEED structured SSD's.

Directional terms such as upper, lower, up, down, top, bottom, etc. are relative and changeable as the system or data is rotated, flipped over, etc. These terms are useful for describing the device but are not intended to be absolutes.

NVM flash memory may be on a flash module that may have a packaged controller and flash die in a single chip package that can be integrated either onto a PCBA, or directly onto the motherboard to further simplify the assembly, lower the manufacturing cost and reduce the overall thickness. Flash chips could also be used with other embodiments including the open frame cards.

Rather than use a controller only for flash-memory storage, additional features may be added. For example, a music player may include a controller for playing audio from MP3 data stored in the flash memory. An audio jack may be added to the device to allow a user to plug in headphones to listen to the music. A wireless transmitter such as a BlueTooth transmitter may be added to the device to connect to wireless headphones rather than using the audio jack. Infrared transmitters such as for IrDA may also be added. A BlueTooth transceiver to a wireless mouse, PDA, keyboard, printer, digital camera, MP3 player, or other wireless device may also be added. The BlueTooth transceiver could replace the connector as the primary connector. A Bluetooth adapter device could have a connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

The size of data such as sectors, pages, blocks may vary. A sector may have 512 bytes, a page may have 16 sectors, and a block may have 128 pages as one of many examples.

The write data in the ETL alternatively can be packed and logged one-by-one to the data write cache as a page unit by the flash controller. The packed data size from the host can be either a large size such as more than a meta-page unit or a small size such as less than a sector. A header is added the show the relation of the data to the LBA from host. A separate packed table maps the LBA from the host to the offset location of the data and header in the meta-page unit of the data write cache. The data write cache can have a capacity of more than two meta-page units in size. When the data write cache is full or an elapsed time is reached, a selected meta-page unit will be moved to the flash memory from the data write cache. The packed table maps the LBA from the host to the offset location of the data and header in the meta-page unit of the flash memory. In the case of overwriting old data from host, if the packed data is still in the data write cache, the old data can be discarded by moving the packed data up and appending the new updated data into the data write cache and updating the packed table. Otherwise, if the packed data is in the flash memory, the new and old data will be compared and a delta data will be generated to show the difference. The delta data and its header will be appended to the data write cache. The new header will also include the previous old data location. The packed table will map the LBA to the delta data position.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A retention flash drive system comprising:
    a retention manager that is periodically activated when a retention-check timer has elapsed, the retention manager sending a vendor command to a flash drive that causes the flash drive to move physical blocks of data before a data-retention limit is reached wherein data stored in flash memory is lost, the retention manager also commanding a Solid-State Drive (SSD) to move a logical block before the data-retention limit is reached;
    an upper-level file filter driver, for executing on a host, for intercepting high-level host writes to a flash drive;
    an encryption/decryption engine, coupled to receive high-level host writes intercepted by the upper-level file filter driver, for generating encrypted data and for decrypting encrypted data;
    a compression/decompression engine, coupled to receive high-level host writes from the upper-level file filter driver, for generating compressed data and for decompressing compressed data;
    wherein compressed data and encrypted data are sent to a File System Driver (FSD) executing on the host;
    a lower-level file filter driver, for executing on the host, for intercepting lower-level file system host writes to a flash drive system;
    a data write cache for storing host write data;
    a data read cache for storing data for reading by the host;
    a grouping engine for grouping data stored in the data write cache into meta-pages;
    an un-grouping engine for un-grouping data in stored in meta-pages into ungrouped data for storage in the data read cache;
    wherein meta-pages are sent from the grouping engine to a volume manager for transfer to a flash memory, and meta-pages stored in the flash memory are received by the un-grouping engine;
    a file priority tag sorter for generating a data type for a host write received;
    a task policy assignor for assigning a priority to tasks including writing of host write data by the data type, wherein priority is a function of the data type from the file priority tag sorter;
    a performance adjustor for adjusting priority of tasks;
    a target assignor for sorting host write data based on the data type generated by the file priority tag sorter;
    a flush manager for flushing data stored in a host DRAM to a SSD DRAM and then to a flash memory of a flash drive system when power is lost;
    a resume manager reloader for fetching flushed data from the flash memory of the flash drive system and then to the host DRAM when power is restored; and
    a disk miniport driver for managing vendor-specific functions of the flash drive system.

2. The retention flash drive system of claim 1 further comprising:
    a retention file, created by the retention manager, of write date of all directories/subdirectories and files based on a file system;
    wherein the retention manager stores the retention file to the flash drive;
    wherein the retention manager manages the retention file periodically when the retention-check timer is activated.

3. The retention flash drive system of claim 2 further comprising:
    a retention routine executed by the retention manager when the retention-check timer is activated;
    wherein retention routine checks write dates of directories, sub-directories, and files in the retention file, wherein when the write date is before a target write date the write date is updated to a current date when data was moved;
    wherein the write date is updated in the retention file.

4. The retention flash drive system of claim 2 further comprising:
    a retention routine executed by the retention manager when the retention-check timer is activated;
    wherein the retention routine writes into the retention file only an earliest write date of directories, sub-directories and files of the file system;
    wherein directories, sub-directories and files are rewritten when the write date in the retention file is before a target write date to ensure data retention;
    wherein the write date is updated in the retention file.

5. The retention flash drive system of claim 2 wherein the vendor command causes the flash drive to move a block at a single physical block address to a location of a new physical block address.

6. The retention flash drive system of claim 2 wherein the vendor command causes the flash drive to move all physical blocks of data without regard to write dates.

7. The retention flash drive system of claim 2 wherein the lower-level file filter driver intercepts lower-level file system host writes to the flash drive system carried on an interface in a plurality of interfaces;
    wherein the plurality of interfaces include internal interfaces and external interfaces, wherein the external interfaces comprise at least two of:
    a Serial AT-Attachment (SATA) bus, a Peripheral Components Interconnect Express (PCIe) bus, a compact flash (CF) bus, a Universal-Serial-Bus (USB), a Non-Volatile-Memory NVMe bus, a Firewire 1394 bus, a Fibre Channel (FC) bus, and a Thunderbolt bus;
    and wherein the internal interfaces comprise at least two of:

a Serial AT-Attachment (SATA) bus, an Integrated Device Electronics (IDE) bus, a Peripheral Components Interconnect Express (PCIe) bus, a compact flash (CF) bus, a Universal-Serial-Bus (USB), and a Secure Digital (SD) bus.

8. The retention flash drive system of claim 2 further comprising:
   a retention routine executed by the retention manager when the retention-check timer is activated;
   the retention routine comprising a method for refreshing a flash memory, the method comprising:
   obtaining a current date;
   for a current block in a list of blocks in the flash memory:
      (a) reading a block status table for a write date of the current block that indicates when the current block was last written;
   calculating a first time delay as a difference of the write date and the current date;
   comparing the first time delay to a retention time;
   when the first time delay exceeds the retention time, moving all valid pages in the current block to empty pages in a spare block in a dynamic-random-access memory (DRAM);
   moving data from the spare block in DRAM to a spare block in the flash memory;
   erasing the current block;
   selecting another block in the list of blocks of flash memory as the current block and repeating from (a) until all blocks in the list of blocks have been processed,
   whereby flash blocks are refreshed.

9. The retention flash drive system of claim 8 wherein the method of the retention routine further comprises:
   when the spare block in the DRAM is full, moving data from the spare block in DRAM to a spare block in the flash memory.

10. The retention flash drive system of claim 8 wherein the current block is a physical block having a physical-block address (PBA).

11. The retention flash drive system of claim 2 wherein the lower-level file filter driver intercepts lower-level file system host writes to the flash drive system carried on an interface in a plurality of interfaces;
   wherein the plurality of interfaces include external interfaces, wherein the external interfaces comprise at least two of:
   a Serial AT-Attachment (SATA) bus, a Peripheral Components Interconnect Express (PCIe) bus, a compact flash (CF) bus, a Universal-Serial-Bus (USB), a Non-Volatile-Memory NVMe bus, a Firewire 1394 bus, a Fibre Channel (FC) bus, and a Thunderbolt bus.

12. The retention flash drive system of claim 2 wherein the lower-level file filter driver intercepts lower-level file system host writes to the flash drive system carried on an interface in a plurality of interfaces;
   wherein the plurality of interfaces include internal interfaces, wherein the internal interfaces comprise at least two of:
   a Serial AT-Attachment (SATA) bus, an Integrated Device Electronics (IDE) bus, a Peripheral Components Interconnect Express (PCIe) bus, a compact flash (CF) bus, a Universal-Serial-Bus (USB), and a Secure Digital (SD) bus.

* * * * *